United States Patent
Klaver et al.

(10) Patent No.: US 8,390,820 B2
(45) Date of Patent: *Mar. 5, 2013

(54) DISPLACEMENT MEASUREMENT SYSTEM HAVING A PRISM, FOR DISPLACEMENT MEASUREMENT BETWEEN TWO OR MORE GRATINGS

(75) Inventors: Renatus Gerardus Klaver, Eindhoven (NL); Erik Roelof Loopstra, Heeze (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/615,685

(22) Filed: Nov. 10, 2009

(65) Prior Publication Data

US 2010/0053586 A1     Mar. 4, 2010

Related U.S. Application Data

(62) Division of application No. 11/384,834, filed on Mar. 21, 2006, now Pat. No. 7,636,165.

(51) Int. Cl.
*G01B 11/02*     (2006.01)

(52) U.S. Cl. .................................................. 356/499

(58) Field of Classification Search .............. 356/487, 356/493, 494, 498, 499, 508, 509, 521; 250/231.14, 250/231.16

See application file for complete search history.

(56) References Cited

U.S. PATENT DOCUMENTS

| | | | |
|---|---|---|---|
| 4,074,131 A * | 2/1978 | Schwebel | ............... 250/237 G |
| 4,577,968 A | 3/1986 | Makosch | |
| 4,779,001 A | 10/1988 | Makosch | |
| 4,985,624 A | 1/1991 | Spillman, Jr. | |
| 5,333,048 A | 7/1994 | Michel et al. | |
| 5,812,320 A | 9/1998 | Maeda | |
| 6,351,313 B1 | 2/2002 | Braasch et al. | |
| 6,907,372 B1 | 6/2005 | Spanner | |
| 7,019,842 B2 | 3/2006 | Holzapfel et al. | |
| 7,061,624 B2 | 6/2006 | Ishizuka | |
| 7,154,609 B2 | 12/2006 | Holzapfel et al. | |
| 7,636,165 B2 | 12/2009 | Klaver et al. | |
| 2005/0007598 A1 | 1/2005 | Ishizuka | |

FOREIGN PATENT DOCUMENTS

| | | |
|---|---|---|
| EP | 0 243 520 A1 | 11/1987 |
| EP | 0 387 520 A2 | 9/1990 |
| EP | 0 628 791 A2 | 12/1994 |
| EP | 0 651 232 A1 | 5/1995 |
| GB | 2 185 314 A | 7/1987 |
| JP | 59-163517 A | 9/1984 |
| JP | 61-130861 A | 6/1986 |
| JP | 62-261004 A | 11/1987 |
| JP | 63-115011 A | 5/1988 |
| JP | 63-231217 A | 9/1988 |
| JP | 05-119284 A | 5/1993 |
| JP | 6-307811 A | 11/1994 |

(Continued)

OTHER PUBLICATIONS

Search Report and Written Opinion for European Application No. 07016985.9 mailed Jun. 12, 2009, 8 pgs.

(Continued)

*Primary Examiner* — Hwa Lee

(74) *Attorney, Agent, or Firm* — Sterne, Kessler, Goldstein & Fox P.L.L.C.

(57) ABSTRACT

A displacement measurement system configured to provide measurement of the relative displacement of two components in six degrees of freedom with improved consistency and without requiring excessive space.

17 Claims, 20 Drawing Sheets

FOREIGN PATENT DOCUMENTS

| | | |
|---|---|---|
| JP | 7-4992 A | 1/1995 |
| JP | 2001-141521 A | 5/2001 |
| JP | 2001-518606 A | 10/2001 |
| JP | 2004-069702 A | 3/2004 |
| WO | WO 99/17073 A1 | 4/1999 |
| WO | WO 99/46603 A1 | 9/1999 |
| WO | WO 02/23131 A1 | 3/2002 |
| WO | WO 02/97375 A1 | 12/2002 |

OTHER PUBLICATIONS

Non-Final Rejection mailed Jun. 16, 2008 for U.S. Appl. No. 11/384,834, 13 pgs.

Final Rejection mailed Feb. 17, 2009 for U.S. Appl. No. 11/384,834, 12 pgs.

Notice of Allowance mailed Aug. 11, 2009 for U.S. Appl. No. 11/384,834, 9 pgs.

English-Language Abstract for JP 2001-141521 A, published May 25, 2001; 1 page.

English-Language Description and Claims for JP 2001-518606 A, published Oct. 16, 2001; 3 pages.

English Translation of Notice of Reasons for Rejection directed to related Japanese Patent Application No. 2007-064291, mailed on Dec. 13, 2010, from the Japanese Patent Office; 3 pages.

English translation of Notice of Reasons for Rejection mailed Oct. 21, 2009 for Japanese Patent Application No. 2007-064291, 3 pgs.

English Abstract for Japanese Patent Publication No. 2001-518606 T published Oct. 16, 2001, 1 pg.

English Abstract for Japanese Patent Publication No. 6-307811 A published Nov. 4, 1994, 1 pg.

Spies, A., "Linear and Angular Encoders for the High-Resolution Range," Proceedings of the 9th International Precision Engineering Seminar, 4th International Conference on Ultraprecision in Manufacturing Engineering, Progress in Precision Engineering and Nanotechnolo, 1997; pp. 54-57.

European Search Report directed to related European Patent Application No. 07250993.8-2213, mailed Jul. 13, 2007, from the European Patent Office; 4 pages.

Partial European Search Report directed to related European Patent Application No. 07016985.9-2213, mailed May 15, 2008, from the European Patent Office; 4 pages.

* cited by examiner

DISPLACEMENT MEASUREMENT SYSTEM HAVING A PRISM, FOR DISPLACEMENT MEASUREMENT BETWEEN TWO OR MORE GRATINGS

CROSS-REFERENCE TO RELATED APPLICATIONS

This application is a divisional of U.S. patent application Ser. No. 11/384,834, filed Mar. 21, 2006 (that issued as U.S. Pat. No. 7,636,165 on Dec. 22, 2009), the entirety of which is incorporated herein by reference.

BACKGROUND OF THE INVENTION

1. Field of the Invention

The present invention relates to a displacement measurement system, lithographic apparatus, and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The continuing drive to produce devices with ever higher component densities means that there is a continuing demand for lithographic processes, which manufacture such devices, to be able to create ever smaller components. A consequence of this is that it is desirable to control the position of components within a lithographic apparatus with ever greater accuracy. For example, as the size of the smallest components to be formed on a substrate decreases, it is desirable to control the position of the substrate with ever greater precision.

Conventionally known precision sensors, such as interferometers, may provide accurate position measurements. However, the accuracy of conventional interferometers is limited by disturbances in the air through which the radiation beam of the interferometer passes. Such disturbances may include air turbulence and thermal variations. Accordingly, the accuracy of conventional interferometers can only be increased by minimizing such disturbances. However, minimizing such disturbances, such as by introducing delays in order to allow the air turbulence to decrease and/or to allow the temperature of the air to settle to within a required value, reduces the throughput of a lithographic apparatus and, accordingly, increases the cost of using the apparatus.

Furthermore, any measurement system may only occupy a limited volume of space within the lithographic apparatus.

BRIEF SUMMARY OF THE INVENTION

It is desirable to provide an improved precision measurement system that is less susceptible to errors but which does not occupy a large amount of space.

According to an embodiment of the invention, there is provided a displacement measuring system configured to measure the displacement between first and second diffraction gratings; wherein the measurement system is configured such that: a first beam of radiation input to the measurement system is divided into first and negative first order diffracted radiation beams by the first diffraction grating; the first and negative first order diffracted radiation beams are further diffracted by the second diffraction grating and subsequently recombined to form a second beam of radiation; the measurement system further includes a sensor configured to determine the relative displacement of the first and second gratings from a determination of the phase difference between a first component of the second beam, derived from the first order diffracted radiation beam, and a second component of the second beam, derived from the negative first order diffracted radiation beam; and wherein the measuring system further includes at least one linear polarizer configured such that the first and second components of the second beam of radiation are linearly polarized, oriented in mutually orthogonal directions.

According to an embodiment of the invention, there is provided a displacement measuring system configured to measure displacement between first and second components; wherein the first component is or is attached to a first elongate diffraction grating oriented such that its elongate direction is parallel to a first direction; the second component is or is attached to a second elongate diffraction grating oriented such that its elongate direction is parallel to a second direction which is not parallel to the first direction; the measurement system further includes a sensor configured to detect a pattern of radiation generated by the diffraction of at least one beam of radiation by the first and second elongate diffraction gratings; and the pattern of radiation is indicative of the displacement of the first elongate diffraction grating relative to the second elongate diffraction grating in a third direction perpendicular to both the first and the second direction.

According to an embodiment of the invention, there is provided a displacement measurement system that measures the movement of a first object relative to a second object, including a first planar diffraction grating mounted to the first object; a second planar diffraction grating mounted to the second object and substantially parallel to the first diffracting grating; and a source providing a first beam of radiation; wherein the first beam of radiation is incident on a first point on the first diffraction grating and diffracted such that first order and negative first order diffracted radiation is incident on the second diffraction grating; the second diffraction grating is configured such that: at least a part of the first order radiation from the first diffraction grating is further diffracted by the second diffraction grating and is incident on a second point on the first diffraction grating; at least a part of the negative first order radiation from the first diffraction grating is further diffracted by the second grating and is incident on the second point on the first diffraction grating; and both radiation derived from the first order diffracted radiation from the first diffraction grating and radiation derived from the negative first order diffracted radiation from the first diffraction grating is further diffracted by the first diffraction grating and propagates from the second point on the first grating in a common direction as a second beam of radiation; and the displacement measurement system further includes a sensor that detects a pattern of radiation derived from the second point on the first diffraction grating, indicative of the relative movements of the two diffraction gratings in a direction parallel to the plane of the diffraction gratings and perpendicular to the striations of the diffraction gratings.

According to an embodiment of the invention, there is provided a displacement measuring system that measures the movement of a first object relative to a second object, including: a first planar diffraction grating, connected to a first prism and mounted to the first object; a second planar diffraction grating, connected to a second prism and mounted to the second object; and a source providing a first beam of radiation; wherein the first beam of radiation is incident on a first point on the first diffraction grating and diffracted such that first order and negative first order diffracted radiation is transmitted through the first prism; the second diffraction grating is arranged such that the first and negative first order diffracted radiation, diffracted by the first grating, is incident on the second diffraction grating at first and second points, on the second diffraction grating, diffracted by the second diffraction grating and propagates into the second prism; the second prism is configured such that radiation propagating from the first and second points on the second diffraction grating is reflected and is incident on third and fourth points on the second diffraction gating, respectively, at an angle parallel to the radiation propagating from the first and second points on the second diffraction grating; the radiation incident on the third and fourth points on the second diffraction grating is further diffracted by the second diffraction grating, passes through the first prism and is incident on a second point on the first diffraction gating and is further diffracted such that radiation derived from the first order and the negative first order radiation first diffracted by the first diffraction grating propagates from the second point on the first diffraction grating in a common direction as a second beam of radiation; and the displacement measuring system further includes a sensor that detects a pattern of radiation indicative of the relative movement of the two diffraction gratings in a direction parallel to the plane of the diffraction gratings and perpendicular to the striations of the diffraction gratings.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIGS. 2a, 2b, 2c, and 2d depict a displacement measurement system according to an embodiment of the present invention;

FIGS. 3a, 3b, 3c, and 3d depict a displacement measurement system according to an embodiment of the present invention;

FIG. 4 depicts a detail of part of a displacement measurement system according to an embodiment of the present invention;

FIGS. 5a, 5b, 5c, and 5d depict a displacement measurement system according to an embodiment of the present invention;

FIGS. 6a, 6b, 6c, and 6d depict a displacement measurement system according to an embodiment of the present invention;

FIGS. 7a, 7b, 7c, 7d, 7e, and 7f depict a displacement measurement system according to an embodiment of the present invention;

FIGS. 8a, 8b, 8c, 8d, and 8e depict a displacement measurement system according to an embodiment of the present invention;

DETAILED DESCRIPTION OF THE INVENTION

Figure 1:
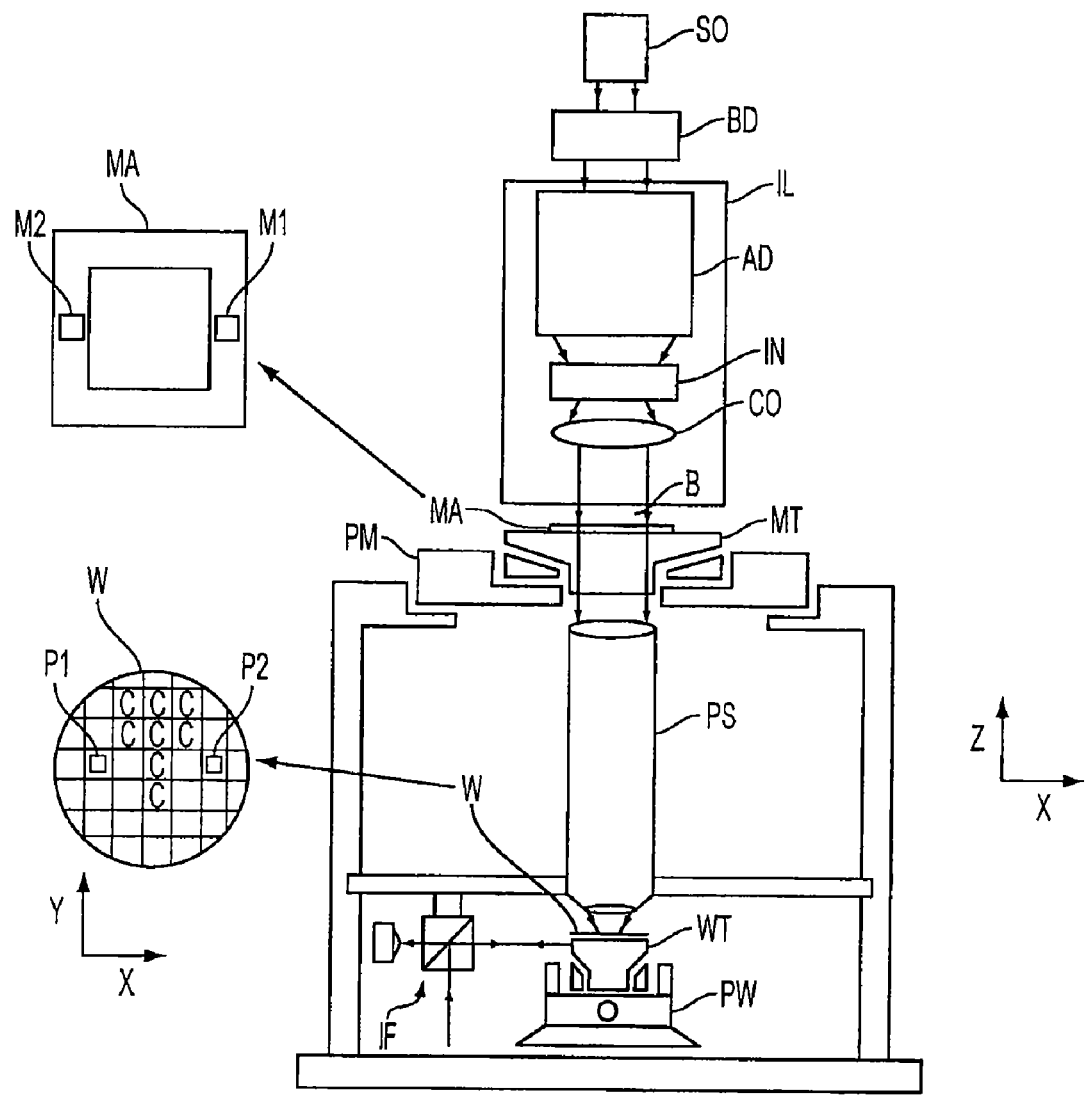

FIG. 1 schematically depicts a lithographic apparatus according to one embodiment of the invention. The apparatus includes an illumination system (illuminator) IL configured to condition a radiation beam B (e.g., UV radiation or EUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target-portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 13:
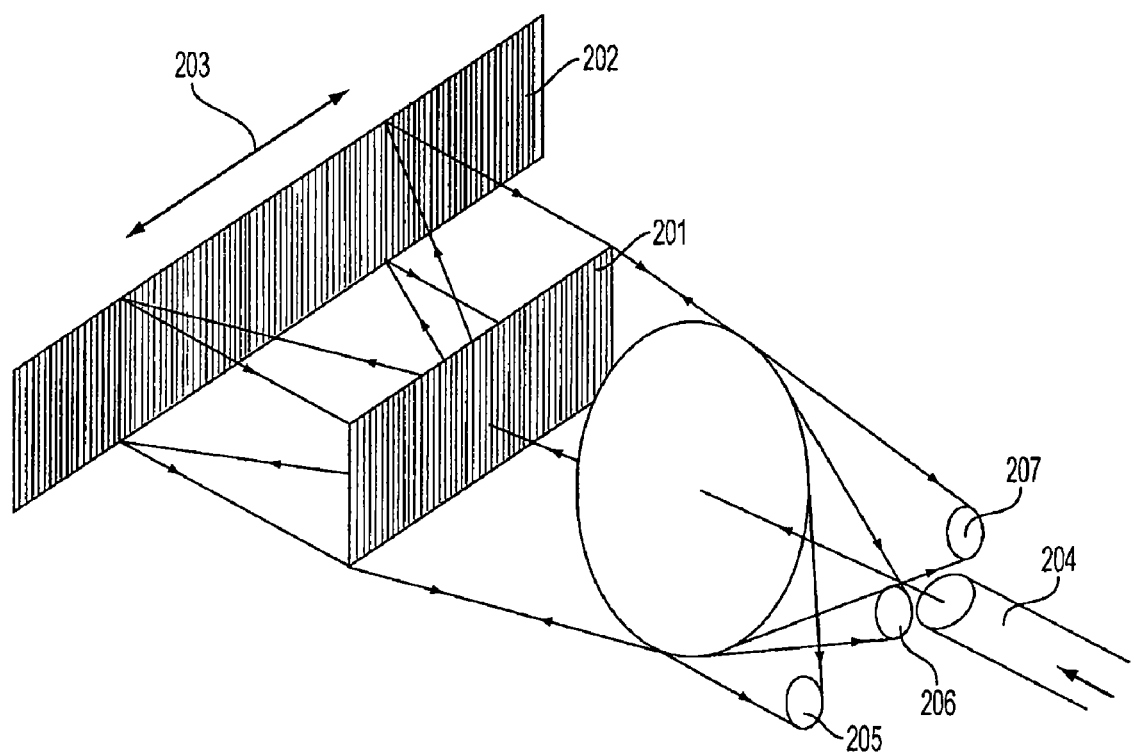
FIG. 13 depicts a relatively simple displacement measurement system in accordance with an embodiment of the invention.

The displacement measuring system of an embodiment of the present invention corresponds to the principles described by SPIES, A. in "Linear and Angular Encoders for the "High-Resolution Range", Progress in Precision Engineering and Nanotechnology, Braunschweig, 1997, incorporated herein by reference. FIG. 13 shows a relatively simple form of such a displacement measurement system 200. It includes a first diffraction grating 201 mounted on a first object and an associated second diffraction grating 202 mounted on a second object. For example, one diffraction grating may be mounted to a reference frame within a lithographic apparatus and the other mounted to a component of the lithographic apparatus of which it is intended that the displacement measurement system will measure the position relative to the reference frame.

The first and second diffraction gratings 201, 202 are planar and arranged such that the planes of the diffraction gratings are substantially parallel to each other. In addition, the striations of each of the diffraction gratings, used to form the gratings, are substantially parallel to one another. In addition, the diffraction gratings are arranged such that diffracted radiation from one of the gratings is received on the other of the gratings.

The position of one grating relative to another may be reliably measured in a direction 203 within a plane substantially parallel to the planes of the diffracting gratings and substantially perpendicular to the striations of the diffraction gratings, using an interferential measurement principle which can yield measurements of sub-nanometer accuracy. When the first diffraction grating moves relative to the second diffraction grating in the direction of measurement, phase differences in the radiation are generated by the diffraction grating arranged to receive diffracted radiation from the other of the diffraction gratings. These generated phase differences are proportional to the displacement of one diffraction grating relative to the other.

In a typical arrangement, a radiation source 204 provides a collimated radiation beam, which is substantially perpendicular to the direction of measurement and is incident on the first diffraction grating 201 where it is diffracted. The positive and negative first order radiation passes as a first diffracted signal to the second diffraction grating 202. At the second diffraction grating 202, the first diffracted light signal is further diffracted and reflected to form a second diffracted signal. The second diffracted signal interferes on the first diffraction grating 201 and is further diffracted to form a third diffracted signal. The third diffracted signal is directed to a sensor having, for example, three photo detectors 205, 206, 207 that are used to measure the phase differences discussed above and hence determine the relative displacement.

Figure 14:
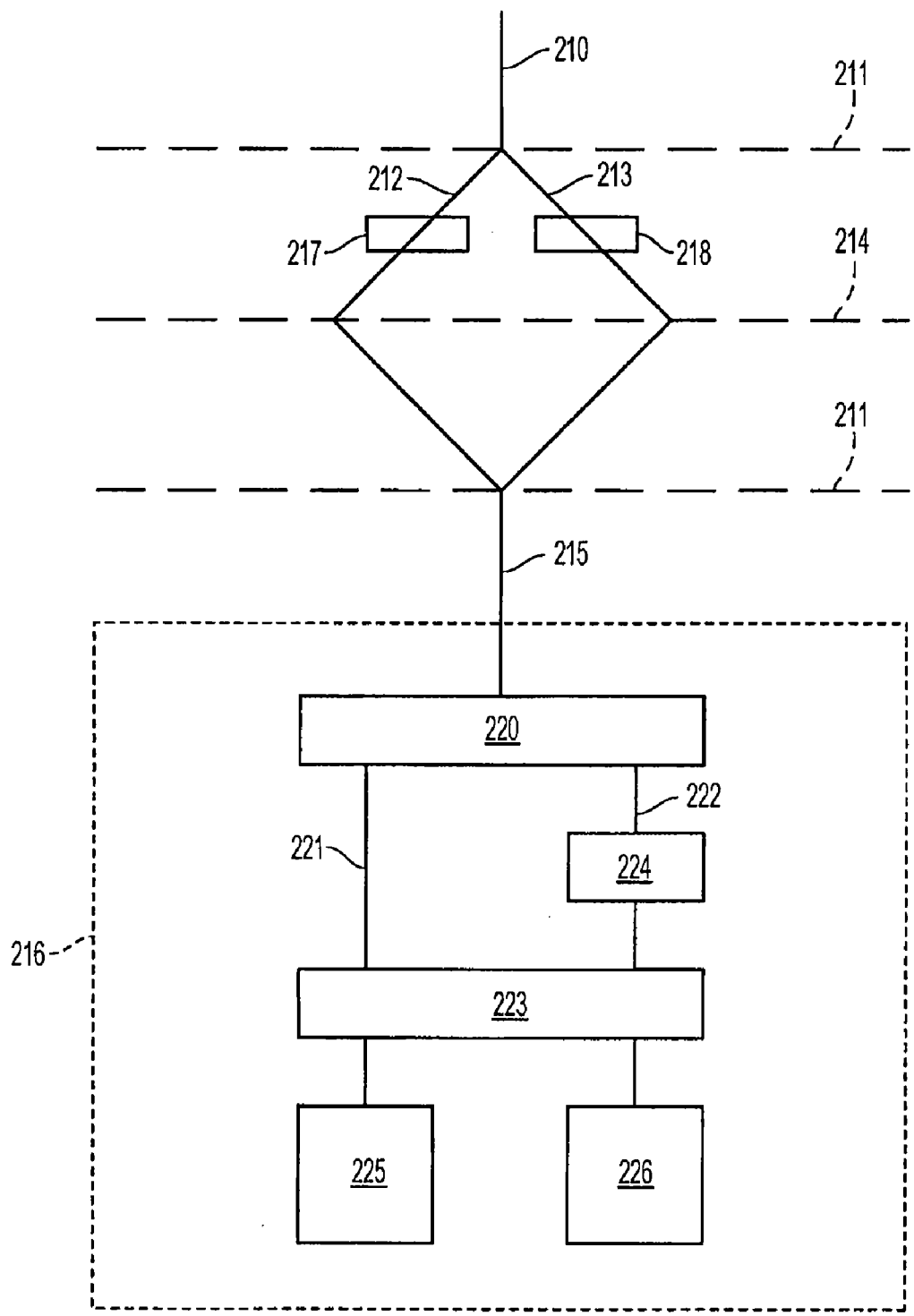
FIG. 14 depicts a schematic arrangement of a displacement measurement system and the sensor unit used therein in accordance with an embodiment of the invention.

FIG. 14 schematically depicts an arrangement of the displacement measurement system in accordance with an embodiment of the invention. The depiction in FIG. 14 does not necessarily correspond to the physical arrangement of the components of the displacement measurement system but is useful for explaining the principle of operation of the displacement measurement system in accordance with an embodiment of the present invention.

As shown, the beam of radiation 210 from a radiation source is divided by a first diffraction grating 211 into first and second beams of radiation 212, 213 corresponding to first and negative first order diffracted radiation, respectively. The first and second beams of radiation 212, 213 are further diffracted by a second diffraction grating 214 and recombined, for example at the first diffraction grating 211, to form a re-combined, information-containing, beam of radiation 215 that is input to a sensor 216 in order to determine the relative displacement of the first and second diffraction gratings 211, 214. As discussed above, the sensor 216 determines the relative displacement of the first and second diffraction gratings 211, 214 from phase differences generated between the first and negative first order diffracted radiation 212, 213. In order to distinguish between the first order and the negative first order diffracted radiation 212, 213, according to an embodiment of the present invention, the radiation may be linearly polarized such that the orientation of the linear polarization of the first order radiation is substantially orthogonal to the orientation of the linearly polarized radiation of the negative first order diffracted radiation. For example, in the arrangement depicted in FIG. 14, linear polarizers 217, 218 are provided between the first diffraction grating 211 and the second diffraction grating 214 in order to linearly polarize the first order and negative first order diffracted radiation in mutually orthogonal directions. A benefit of using linear polarizers is that it is relatively easy to manufacture them as elongate components. Accordingly, they may conveniently be used to form displacement measurement systems that have a large working range.

It should be appreciated that although the linear polarizers 217, 218 are only depicted in FIG. 14 between the first and second diffraction gratings 211, 214 such that the first and negative first order diffracted radiation 212, 213 passes through the linear polarizers 217, 218 before reaching the second diffraction grating 214, the first order and negative first order diffracted radiation 212, 213 may pass through the linear polarizers 217, 218 a second time after being diffracted by the second diffraction grating 214 before being recombined at the first diffraction grating 211 to form the information-containing beam of radiation 215.

Accordingly, the information-containing beam of radiation 215 includes radiation derived from the first and negative first order diffracted radiation, respectively, each component being linearly polarized in an orientation substantially orthogonal to the other and each component being parallel to the other and having a common axis. The phase difference between the two components is indicative of the relative displacement of the first and second diffraction gratings 211, 214.

The sensor 216 includes a non-polarizing beam splitter 220 that divides the information-containing beam of radiation 215 into at least first and second information-containing sub-beams of radiation 221, 222. These sub-beams of radiation 221, 222 may have the same properties as the information-containing beam of radiation 215 except that its intensity is divided between them. As depicted in FIG. 14, both sub-beams of radiation 221, 222 are directed through a polarizer 223 that is arranged with a polarizing axis that is at substantially 45° relative to the orientations of the linearly polarized radiation of both components of the information-containing beam of radiation 215. It should be appreciated that separate such polarizers may be provided for each sub-beam of radiation. In the case of the first sub-beam of radiation 221, the radiation may be directed directly from the beam splitter 220 to the polarizer 223. In the case of the second sub-beam of radiation 222, the radiation from the beam splitter 220 is passed through a waveplate 224 before reaching the polarizer 223. The waveplate 224 is oriented such that the fast axis and the slow axis of the waveplate are substantially parallel to the orientation of the linearly polarized radiation of the components of the information-containing beam of radiation 215. Having passed through the polarizer 223, the sub-beams of radiation are directed to respective light intensity detectors 225, 226.

The sensor 216 is configured to determine the phase difference between the components of the information-containing beam of radiation 215 corresponding to the first and negative first order diffracted radiation 212, 213. This phase difference is determined by the relative displacement of the first and second diffraction gratings 211, 214 and is designated cp. The intensity of the radiation detected by the first radiation intensity detector 225, corresponding to the sub-beam of radiation 221 that is not passed through a waveplate, has a maximum intensity when $\phi$ is $0+2n\pi$, where n is an integer. As the first diffraction grating 211 moves relative to the second diffraction grating 214, the phase $\phi$ changes, resulting in a change of intensity detected by the first radiation intensity detector 225. Accordingly, monitoring the oscillation of the intensity detected by the radiation intensity detection 225 makes it possible to detect the displacement of the first diffraction grating 211 relative to the second diffraction grating 214.

The second radiation intensity detector 226 detects a corresponding signal. However, the waveplate 224 is configured to introduce a phase shift of $0+2m\pi$, where m is an integer. Accordingly, $\theta$ can be selected such that the signals detected by the radiation intensity sensors 225, 226 as the diffraction gratings move relative to each other are out of phase, for example by 90°. Consequently, when monitoring the intensity detected by both the first and the second radiation intensity detectors 225, 226, it is possible to not only determine the magnitude of the displacement of the first diffraction grating 221 relative to the second diffraction grating 214 but also the direction of the displacement. Furthermore, monitoring both signals improves the accuracy of the measurement. For example, as the first diffraction grating 211 moves relative to the second diffraction grating 214, of the radiation detected by one of the radiation intensity sensors 225, 226 reaches a maximum, the change in intensity detected by that detector for a given relative movement of the first and second diffraction gratings 211, 214, becomes smaller, reducing the accuracy possible from considering the output of that radiation intensity sensor alone. However, because the signals from the two radiation intensity sensors 225, 226 are not in phase, the other of the radiation intensity sensors will not be detecting the maximum radiation intensity at the same time and accordingly will be able to provide an accurate measurement of the relative displacement of the first and second diffraction gratings 211, 214.

Further improvements in accuracy may be achieved by providing further sub-beams of radiation from the radiation beam splitter 220 and arranging the additional sub-beams of radiation in the same manner as the second sub-beam of radiation 22 but such that each sub-beam of radiation has a waveplate with a different thickness, corresponding to different phase difference. For example, in an arrangement with three sub-beams of radiation, the sensor 216 may be configured such that the second and third radiation intensity detectors (namely those including waveplates in their beam paths) are about 120° and 240°, respectively, out of phase with the signal detected by the first radiation intensity detector. It should be appreciated that any convenient number of sub-beams of radiation may be used.

The encoders as described above effectively measure a phase difference between radiation derived from the first order diffracted radiation from the first diffraction grating and the negative first order diffracted radiation from the first diffraction grating. The phase difference is dependent on the relative position of the two gratings and changes as one grating moves relative to another. However, differences in the environmental conditions of one beam path relative to another, may reduce the accuracy of the measurement, especially because the pathlength for which the beams follow different paths may be for a large proportion of the total pathlength of radiation in the displacement measurement sensor.

Accordingly, a displacement measurement system according to an embodiment of the present invention has been proposed. Such a displacement measurement system is depicted in FIGS. 2a, 2b, 2c, and 2d which are, respectively, a top view of the system, a side view of the system, a front view of the system and a perspective view of the system.

A first beam of radiation 10 is provided by a radiation source 11. It will be appreciated that a radiation source 11 may include a component for generating the radiation beam 10. Alternatively, the beam of radiation may be generated external to the displacement measurement system (and, where the displacement measurement system is used as part of lithographic apparatus, possibly external to the lithographic apparatus itself) in which case the source 11 will direct and/or condition the radiation as necessary to provide the beam of radiation 10.

As shown, the beam of radiation 10 is directed by way of a first reflector 12 to a first diffraction grating 13. The first beam of radiation 10 is incident on the first diffraction grating 13 at a point 14. The diffraction grating 13 is transmissive and a first sub-beam of radiation 15, corresponding to positive first order diffracted radiation from the first diffraction grating 13, and a second sub-beam of radiation 16, corresponding to negative first order diffracted radiation diffracted from the first grating 13, are incident on a second grating 17. The second grating 17 is reflective. The sub-beams of radiation 15, 16, corresponding to the first order diffracted radiation and the negative first order diffracted radiation are reflected and diffracted by the second diffraction grating 17. The second diffraction grating is specifically configured such that diffracted radiation 18, derived from the positive first order radiation 15 diffracted by the first grating 13 is reflected back from the second diffraction grating 17 to a second point 20 on the first diffraction grating 13. Likewise, diffracted radiation 19, derived from the negative first order radiation 16 diffracted by the first diffraction grating 13 is diffracted by the second grating 17 and reflected back to the second point 20 on the first diffraction grating 13. Both sub-beams of radiation 18, 19 are subsequently further diffracted by the first diffraction grating 13 and effectively recombined to form a second beam of radiation 21. Accordingly, although radiation corresponding to the positive first order diffracted radiation and the negative first order diffracted radiation have followed a different path for a portion of their respective lengths, the length of the path for which they have followed different paths is relatively short compared to a conventional displacement measurement system. In particular, the proportion of the total pathlength for which the first and negative first order diffracted radiation follows different paths is far shorter in the arrangement according to the embodiment of the invention than in the conventional arrangement. Accordingly, the system according to the embodiment of the present invention shown in FIGS. 2a-d is less sensitive to variation in the air through which the beam passes, such as turbulence and thermal variations.

A convenient way of configuring the first and second diffraction gratings to ensure that the radiation derived from the positive first and negative first order diffracted radiation from the first grating coincides on the first grating once it has been diffracted by the second grating is to select the first and second diffraction gratings such that the pitch of the second diffraction grating is about half that of the first diffraction grating.

As depicted in the embodiment of FIGS. 2a-d, the second beam of radiation 21 may be reflected by a second reflector 22 to a cornercube 23 which returns the second beam of radiation to the second reflector 22 in a direction substantially parallel to that which it was provided to the cornercube. The second beam of radiation 21 is subsequently again reflected by the second reflector 22 and, accordingly, directed back on to the first grating 13.

Accordingly, the second beam of radiation 21 undergoes the same process as the first beam of radiation 10, namely is diffracted by the first diffraction grating 13, diffracted and reflected by the second diffraction grating 17 and radiation, corresponding to the first order and negative first order diffracted radiation from the first diffraction by the first diffraction grating 13 is incident on a single point 24 on the first diffraction grating, whereupon it is further diffracted and combined to form a single third beam of radiation 25 which is reflected by the first reflector 12 to the sensor 26 which, in the conventional manner, determines the relative movement of the first and second diffraction gratings 13, 17.

As a consequence of the second beam of radiation 21 being redirected through the system of diffraction gratings 13, 17 a second time, the system is made less sensitive to errors caused by rotations of one component relative to another, for example of the first diffraction grating 13 relative to the second diffraction grating 17.

Figure 2A:
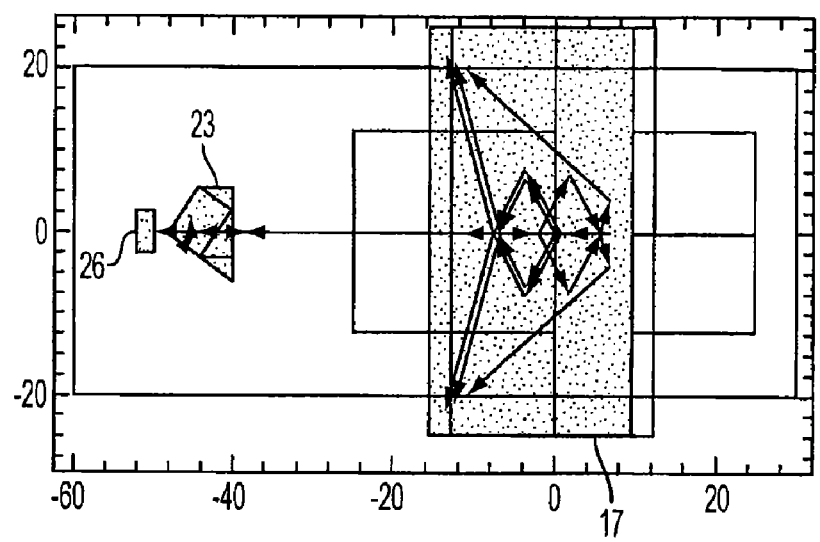
Figure 2B:
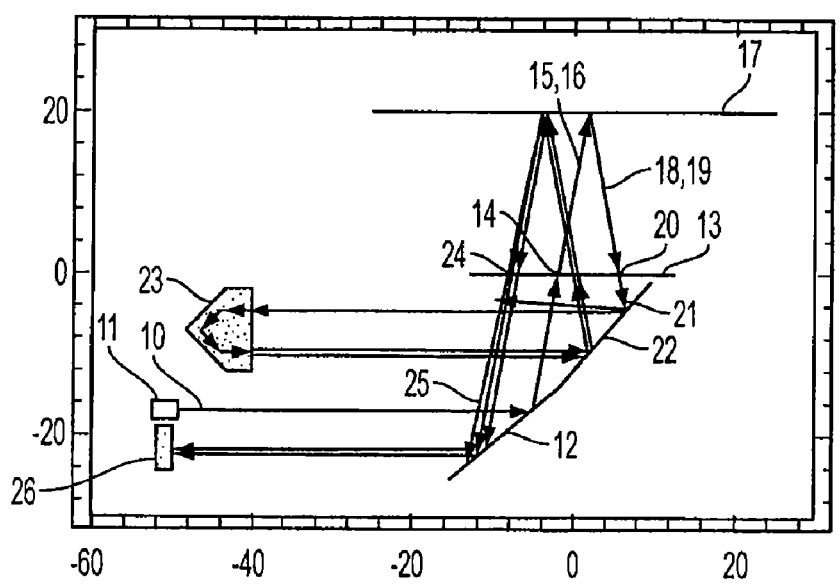
Figure 2C:
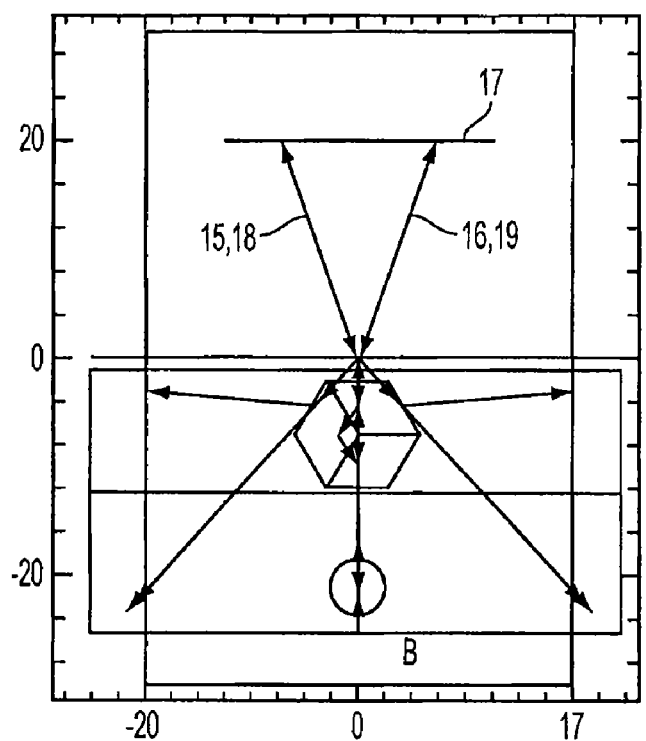
Figure 2D:
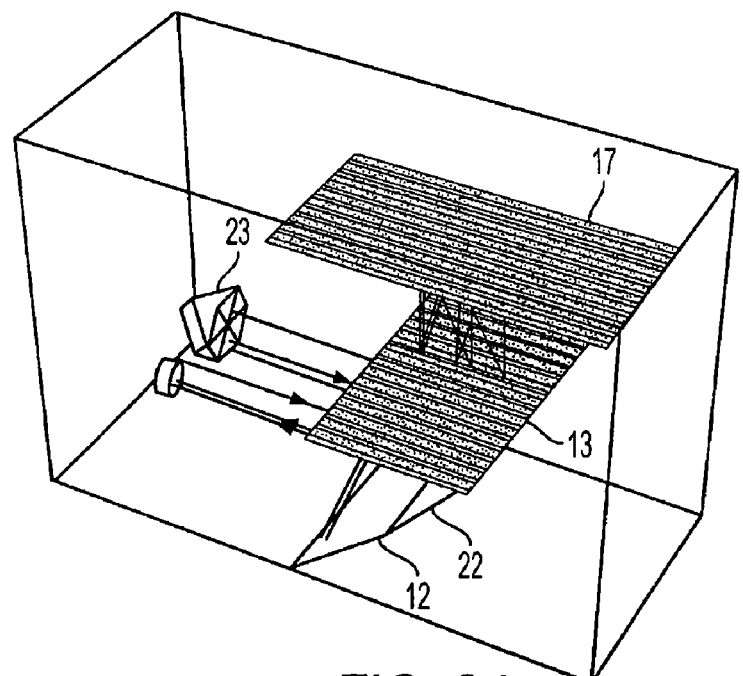

The perspective view of the embodiment of the displacement measurement system, shown in FIG. 2d, shows the orientation of the striations of the diffraction grating 13, 17. It is to be understood that, in line with conventional displacement measurement systems, the direction of movement that is measured by the displacement measurement system is relative movement of the two diffraction gratings 13, 17 in a direction substantially parallel to the plane of the diffraction gratings and substantially perpendicular to the direction of the striations of the diffraction gratings, which are mutually parallel.

As suggested above, the displacement measurement system according to an embodiment of the present invention may be used to measure the displacement of one component within a lithographic apparatus relative to another. For example, a displacement measurement system depicted in embodiment 1 and described above, may be used to measure the displacement of a substrate table in a lithographic apparatus relative to a reference frame. From this, the position of the substrate table relative to the reference frame may be determined. Accordingly, in turn, it is possible to determine the position of the substrate table relative to other components within the lithographic apparatus such as the projection system. In such a situation, the first diffraction grating 13 and the first and second reflectors 12, 22 may be connected to, for example, an edge of the substrate table and the second diffraction grating 17 and the cornercube 23 may be connected to the reference frame. Accordingly, measurement of the displacement of the second diffraction grating 17 relative to the first diffraction grating 13 corresponds to the displacement of the substrate table relative to the reference frame. The radiation source 11 and the sensor 26 may also be mounted to the reference frame.

Figure 3C:
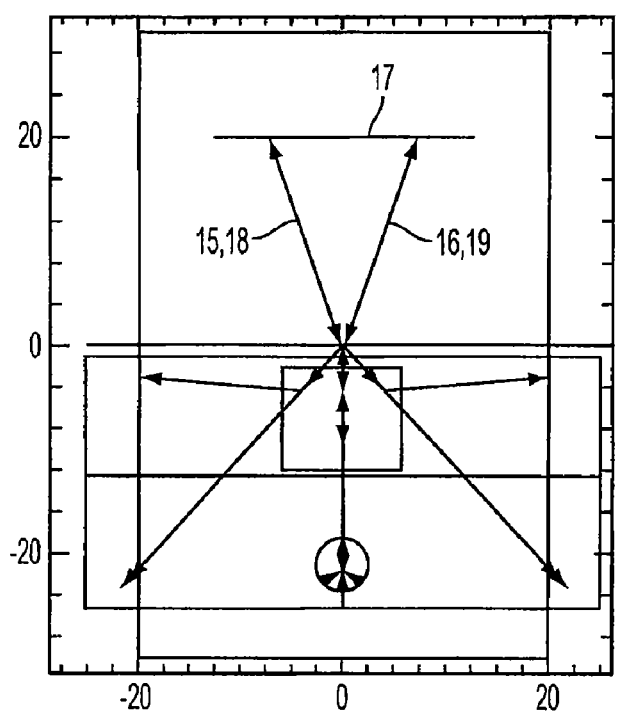
Figure 3D:
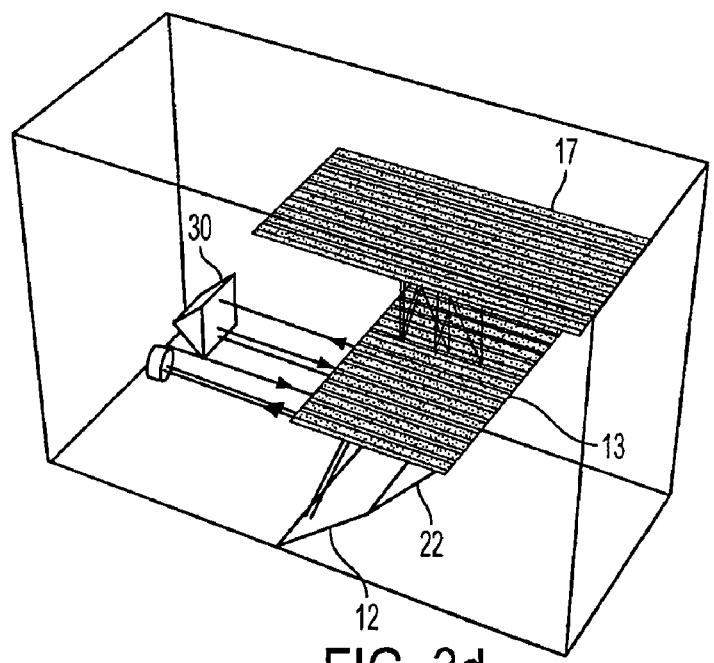
Figure 4:
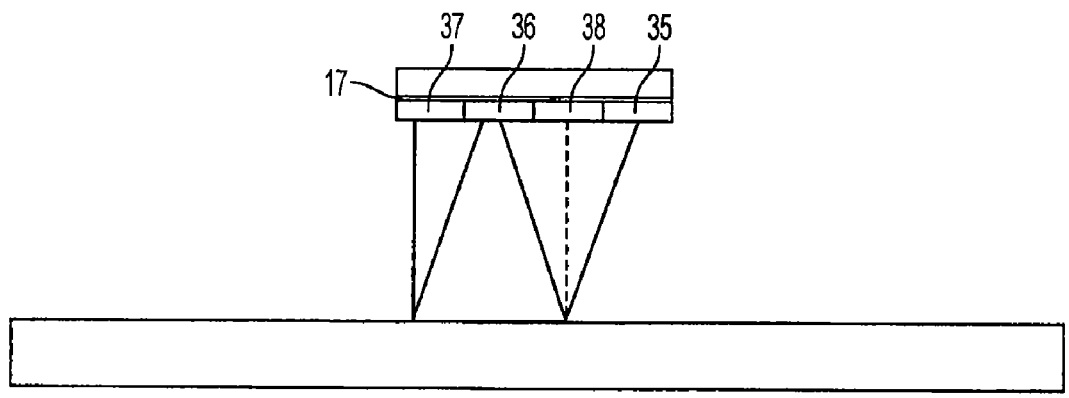

In the manner as described above in relation to the embodiment of the invention shown in FIGS. 13 and 14, in the displacement measurement system of this embodiment of the present invention, the polarization of at least one of the negative first order radiation and the positive first order radiation diffracted from the first diffraction grating may be polarized. In a convenient arrangement as shown in FIG. 4 (which is a partial front view of the displacement measurement system corresponding to FIGS. 2c and 3c), polarizers 35, 36 may conveniently be provided on the second grating 17. As shown in FIG. 4, if desired, an absorber 38 may be provided to absorb the zero order radiation. Preferably, the polarizers 35, 36 corresponding to the first order and negative first order radiation 31, 32 diffracted from the first diffraction grating 13, respectively, polarize the radiation in mutually orthogonal directions.

FIGS. 3a, 3b, 3c, and 3d depict a top view, a side view, a front view and a perspective view, respectively, of a displacement measurement system according to a second embodiment of the present invention. Much of the embodiment of FIGS. 3a-d is identical to the embodiment of FIGS. 2a-d and the description thereof will not be repeated. The embodiment of FIGS. 3a-d differs from the embodiment of FIGS. 2a-d in that the cornercube 23 is replaced with a prism 30.

Figure 3A:
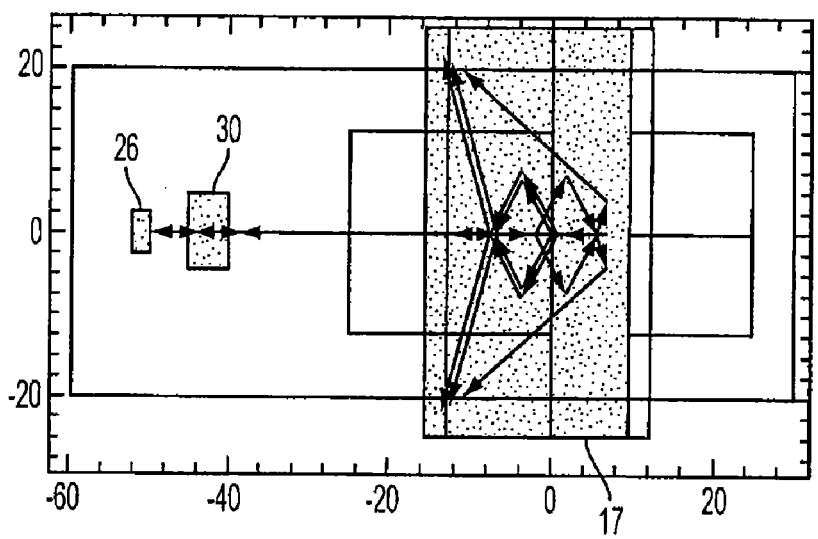
Figure 3B:
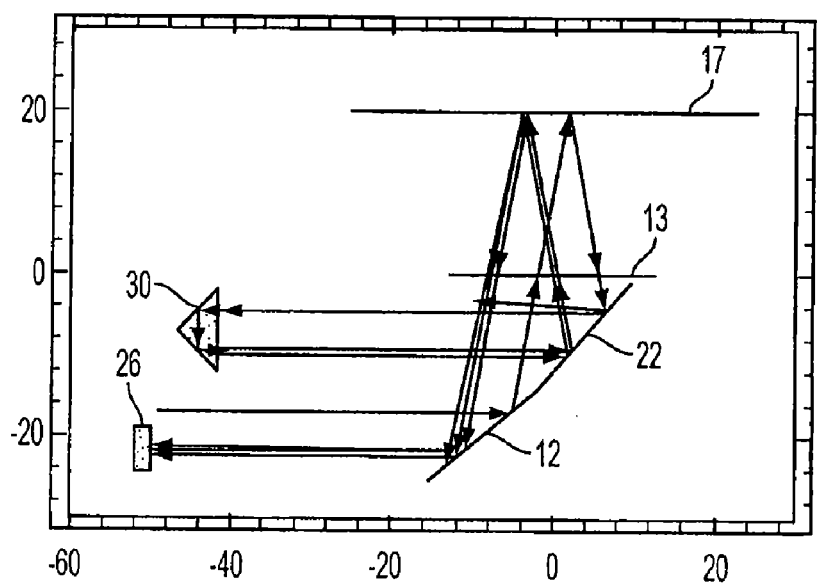

A benefit of using a prism in place of a cube corner is that it can be formed as an elongate component, for example having the cross-section such as shown in FIG. 3b but extending the full length of the object to which it is attached. In contrast, the cube corner cannot be made in an elongate form. Accordingly, whereas the cube corner should be mounted to the same object as the second diffraction grating, a prism may be mounted to either object and, if mounted to the first object, is formed as an elongate prism. For example, in the context of a lithographic apparatus, it is possible to mount a prism on the substrate table, running the length of one side of the substrate table whereas a cube corner would need to be mounted to the reference frame. The former arrangement provides a displacement measurement sensor that is less sensitive to rotations of the substrate table.

A further benefit of a displacement measuring system using a prism is that, although not depicted in FIGS. 3a, 3b, 3c, and 3d, the displacement measurement system may be further configured to sense the zero order radiation transmitted through the first diffraction grating. The difference in path length between the zero order radiation and either one of the first order and negative first order radiation diffracted by the first diffraction grating, is dependent on the separation of the first and second diffraction gratings in a direction substantially perpendicular to the plane of the first and second diffraction gratings. Accordingly, by configuring the sensor to compare the path length of the zero order radiation with at least one of the positive first and negative first order radiation, the displacement measurement system of an embodiment of the present invention is able to measure the separation of the diffraction gratings (and hence the components to which they are attached) in a direction substantially perpendicular to the plane of the diffraction gratings, in addition to measuring the displacement in a direction substantially parallel to the plane of the diffraction gratings and substantially perpendicular to the striations of the diffraction gratings.

As shown in FIG. 4, if the displacement measurement system is to measure the displacement of the diffraction gratings in a direction substantially perpendicular to the plane of the gratings, an additional polarizer 37 may be provided on the second grating and oriented such that the zero order radiation 34 and the one of the first and negative first order radiation 33 being used to detect the displacement perpendicular to the plane of the gratings are polarized in substantially mutually orthogonal directions.

Figure 5A:
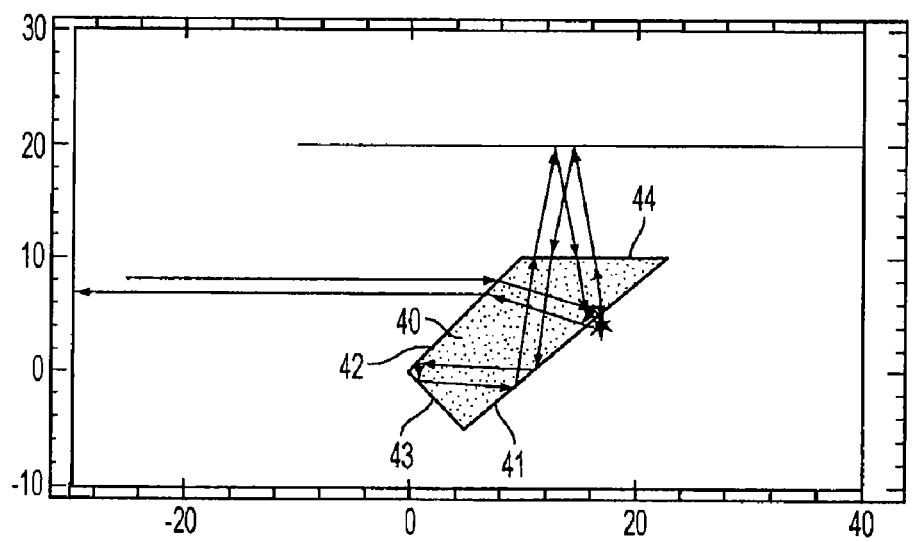

FIG. 5a depicts a side view of a displacement measurement system according to an embodiment of the present invention. This embodiment is similar to the embodiment of FIGS. 3a-d and therefore only the differences between the two embodiments will be described. As shown, the reflectors and the corner prism of the embodiment of FIGS. 3a-d have been replaced with a single prism 40. A single face 41 of the prism 40 takes the place of the reflectors in the embodiment of FIGS. 3a-d. Likewise the corner between two further faces 42,43 of the prism 40 takes the place of the corner prism of the embodiment of FIGS. 3a-d. As a further benefit, the first grating 13 may be formed on a fourth face 44 of the prism 40. If the displacement measurement system is to be used to measure the displacement of a substrate table within a lithographic apparatus, for example, this embodiment may be particularly beneficial. This is because only a single component, namely the prism 40 needs to be mounted to the edge, for example, of the substrate table. This not only facilitates the manufacture of the lithographic apparatus but also minimizes the space requirements of the displacement measurement system within the lithographic apparatus and minimizes the possibility of errors being introduced by variations in the position of components of the displacement measurement system relative to other components within the displacement measurement system.

Figure 5B:
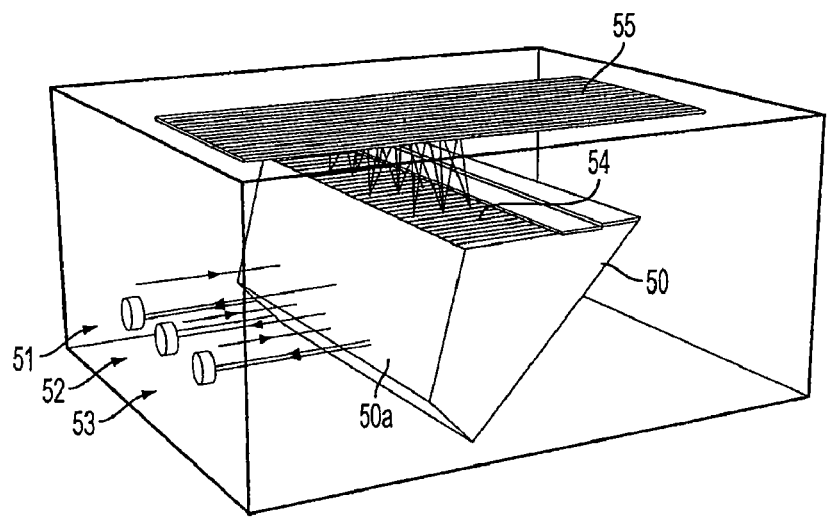
Figure 5C:
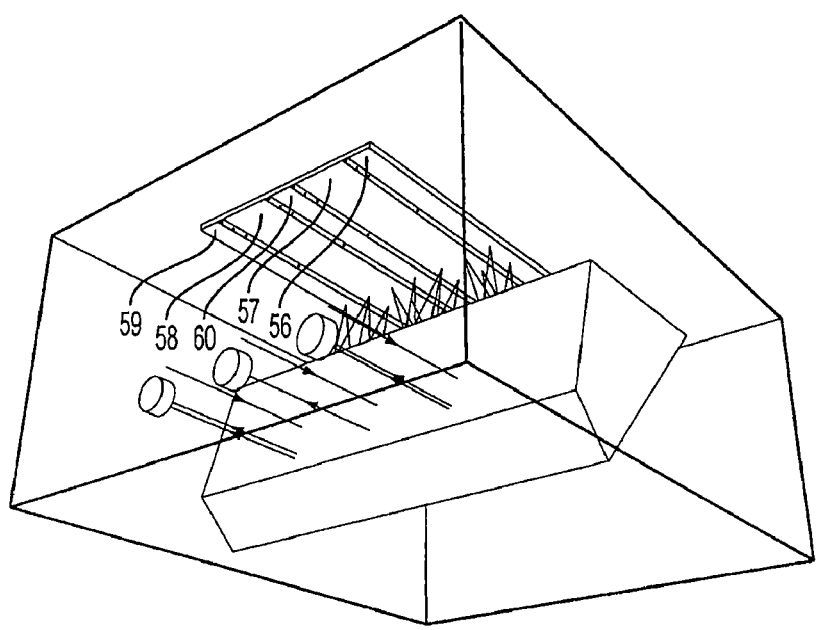

FIGS. 5b and 5c depict perspective views of a displacement measurement system corresponding to that shown in FIG. 5a.

As shown, the system has three displacement measurement systems 51, 52, 53. The first and third displacement measurements systems 51, 53 measure the relative displacement of the first and second diffraction gratings 54, 55 in a direction substantially perpendicular to the plane of the diffraction gratings 54, 55. It will be appreciated that because the first and third displacement measurement systems are separated from each other in a direction substantially perpendicular to their measurement directions, it is also possible to measure a relative rotation of the two diffraction gratings 54, 55. The second displacement measurement system 52 is used to measure the relative displacement of the diffraction gratings 54, 55 in a direction substantially parallel to the plane of the diffraction gratings 54, 55 but substantially perpendicular to their striations.

In a manner corresponding to that discussed above in relation to FIG. 4, polarizers 56, 57, 58, 59 are provided, attached to the second diffraction grating 55 to polarize the two portions of the radiation used for each displacement measurement system in mutually orthogonal directions. As depicted polarizers 56, 58 polarize radiation in an orthogonal direction to polarizers 57, 59. An absorber 60 is provided to absorb the zero order radiation of the second displacement measurement system 52.

Figure 5D:
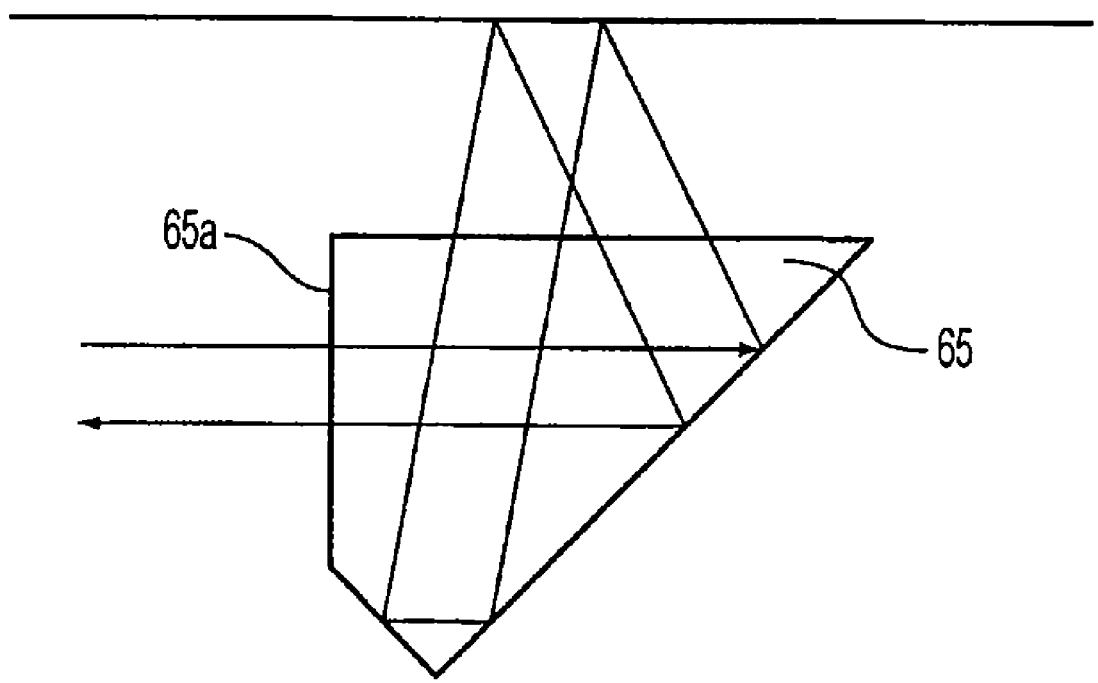
Figure 6A:
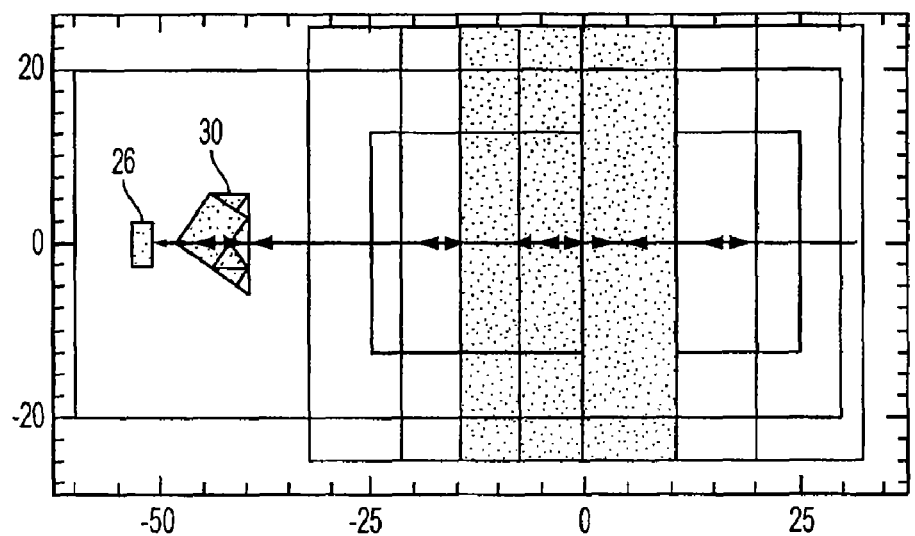
Figure 6B:
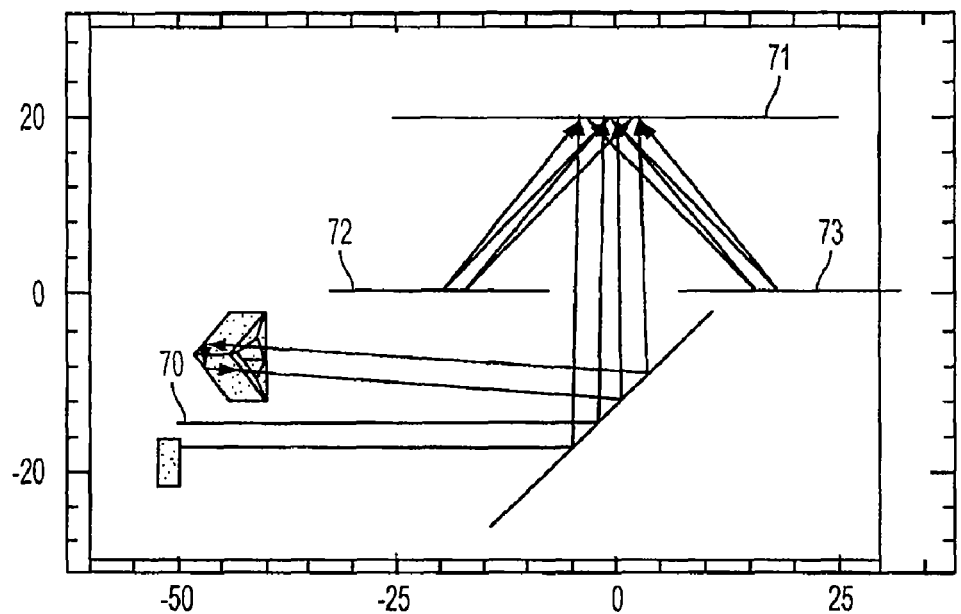
Figure 6C:
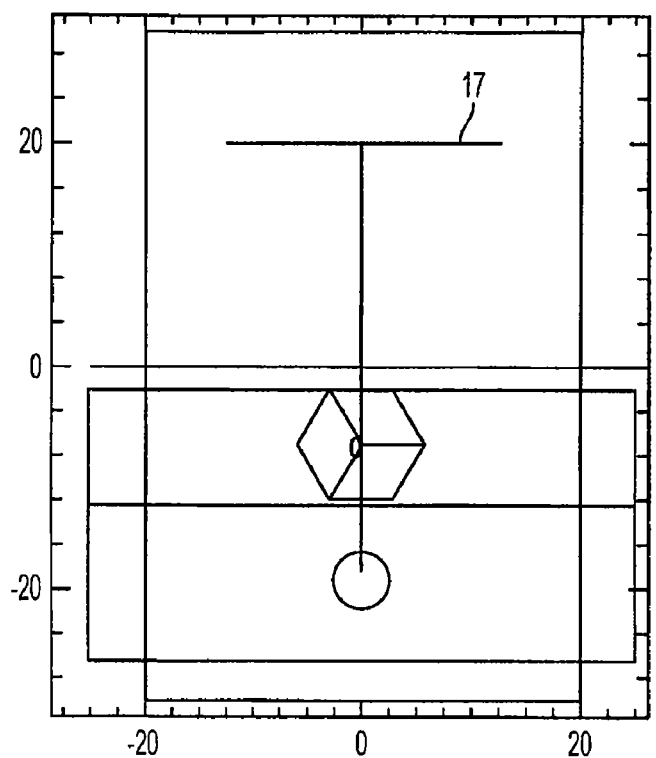
Figure 6D:
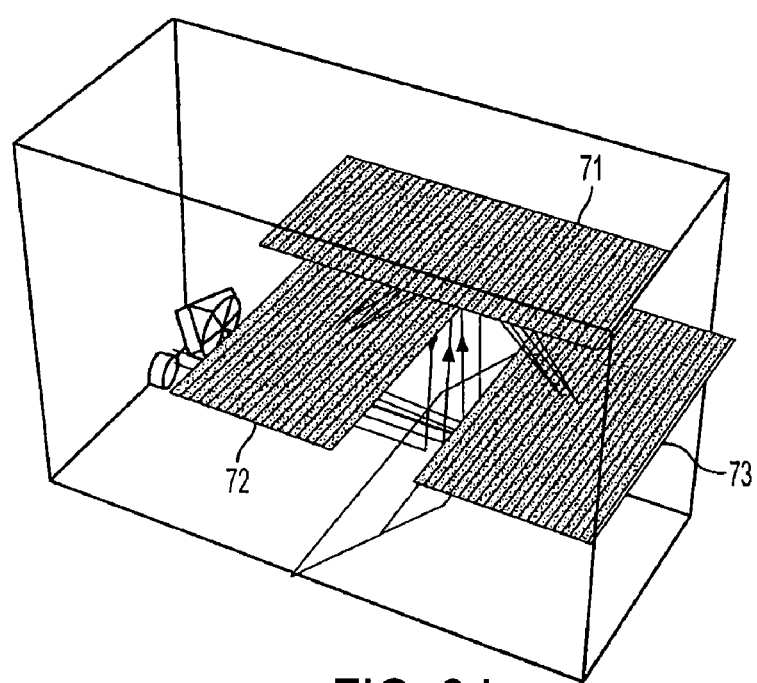

FIG. 5d depicts, in cross section, a variant of the arrangement of FIGS. 5a, 5b and 5c. In this case the prism 65 is arranged such that the face 65a of the prism on which the radiation from the radiation source is initially incident is substantially perpendicular to the beam of radiation. Consequently the radiation does not refract at the boundary between the air and the face 60a of the prism.

FIGS. 6a, 6b, 6c, and 6d depict a top view, a side view, a front view, and a perspective view, respectively, of a displacement measurement system according to an embodiment of the present invention. In this embodiment, both diffraction gratings may be reflective. This may be particularly beneficial for use with radiation that is readily absorbed. It may further ease the manufacture of the diffraction gratings. An additional benefit is that, in this case, the displacement measurement direction is substantially parallel to the direction of the beam radiation provided by the source.

In this case, the first beam of radiation 70 is directed onto the first diffraction grating 71 between first and second parts 72, 73 of the second diffraction grating. The second diffraction grating may be formed as two entirely separate diffraction gratings or may be formed as a single diffractive grating with a gap in the middle. The first diffraction grating 71 and the first and second parts 72, 73 of the second diffraction grating are configured such that the first order diffracted radiation diffracted by the first diffraction grating 71 is incident on the first part 72 of the second diffraction grating and the negative first order diffracted radiation diffracted by the first diffraction grating 71 is incident on the second part 73 of the second diffraction grating. As with the other embodiments, the first and second parts 72, 73 of the second diffraction grating are configured such that radiation is diffracted at each and reflected back to a common point on the first diffraction grating 71 to form a common beam such that the first order radiation and the negative first order radiation diffracted by the first diffraction grating follows a common beam path to as great an extent as possible.

FIGS. 7a, 7b, 7c, and 7d depict a top view, a side view, a front view and a perspective view, respectively, of a displacement measurement system according to an embodiment of the present invention. As shown, a first beam of radiation 81 is provided by a source of radiation 80. It will be appreciated that, as with the other embodiments of the invention, the radiation source 80 may include a component for generating the radiation beam 81. Alternatively, the beam of radiation may be generated external to the displacement measurement system (and, where the displacement measurement system is used as part of a lithographic apparatus, possibly external to the lithographic apparatus itself), in which case the source 80 will direct and/or condition the radiation as necessary to provide the beam of radiation 81.

As shown in FIGS. 7a to 7d, the beam of radiation 81 may be directed by way of a reflector 82 to a first diffraction grating 83. As shown, the first diffraction grating 83 is transmissive and connected to a first prism 84. It will be appreciated that there may be a gap between the first diffraction grating 83 and the first prism 84. However, as shown in FIGS. 7a to 7d, there may be no separation between the first diffraction grating 83 and the first prism 84. In particular, the first diffraction grating 83 may be formed on the surface on the first prism 84.

The radiation is incident on a first point on the first diffraction grating 83 and diffracted, generating first order and negative first order diffracted radiation 85, 86. The first order and negative first order diffracted radiation 85, 86 propagates through the first prism 84 and is incident on the second diffracting grating 87 at first and second points on the second diffraction grating, respectively. The second diffraction grating 87 is also transmissive and attached to a second prism 88. As with the first diffraction grating 83 and the first prism 84, the second diffraction grating 87 and the second prism 88 may be connected such that there is a gap between them or such there is no gap between them. Likewise, the second diffraction grating 87 may be formed on a face of the second prism 88.

The radiation derived from the first order and negative first order diffracted radiation 85, 86 diffracted by the first diffraction grating 83 and incident on the first and second points on the second diffraction grating 87, respectively, is further diffracted by the second diffraction grating 87 and propagates through the second prism 88. The second prism 88 is shaped such that radiation propagating from the first and second points on the second diffraction grating 87 is reflected in such a manner as to be incident on the second diffraction grating 87 at third and fourth points, respectively, on the second diffraction grating 87, in a direction substantially parallel to the direction of propagation of radiation propagating from the first and second points on the second diffraction grating 87. The radiation incident on the third and fourth points on the second diffraction grating 87 is subsequently further diffracted by the second diffraction grating 87, propagates through the first prism 84 and is incident on a second point on the first diffraction grating 83. Accordingly, radiation derived from both the first order and negative first order of diffracted radiation 85,86, initially diffracted by the first diffraction grating 83, is incident on a common point, the second point, on the first diffraction grating 83. This radiation is further diffracted by the first diffraction grating 83 and propagates from the second point on the first diffraction grating in a common direction as a second beam of radiation 89 which may be reflected to the sensor 90. Subsequently, in a manner as discussed above, the sensor 90 may determine the relative movement of the first and second diffraction gratings 83, 87.

Figure 7A:
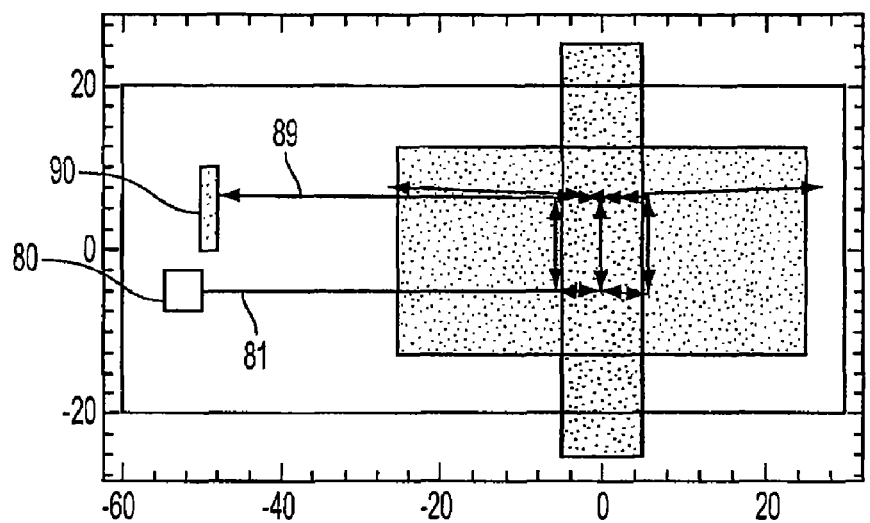
Figure 7B:
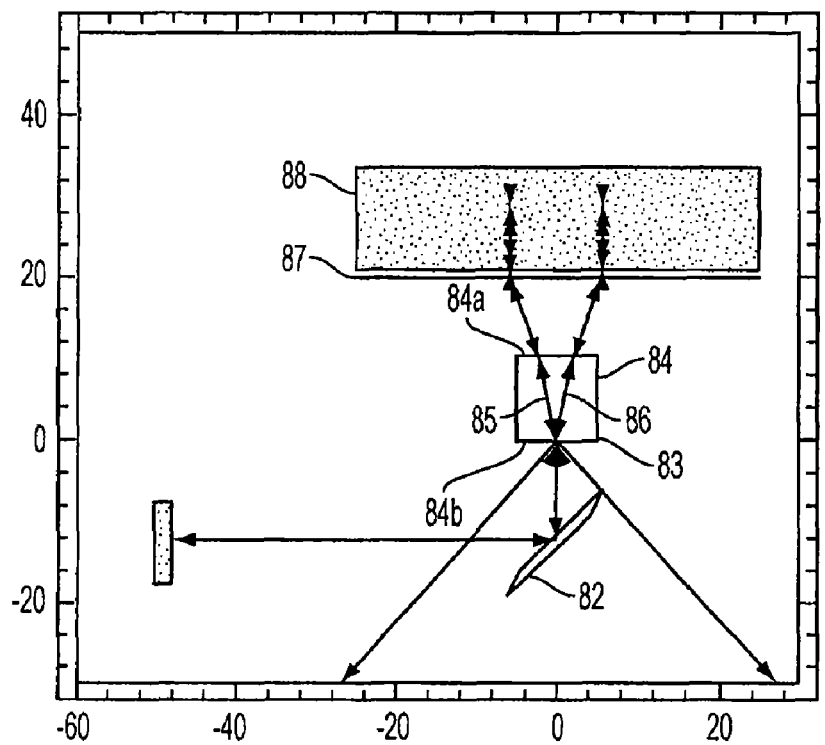
Figure 7C:
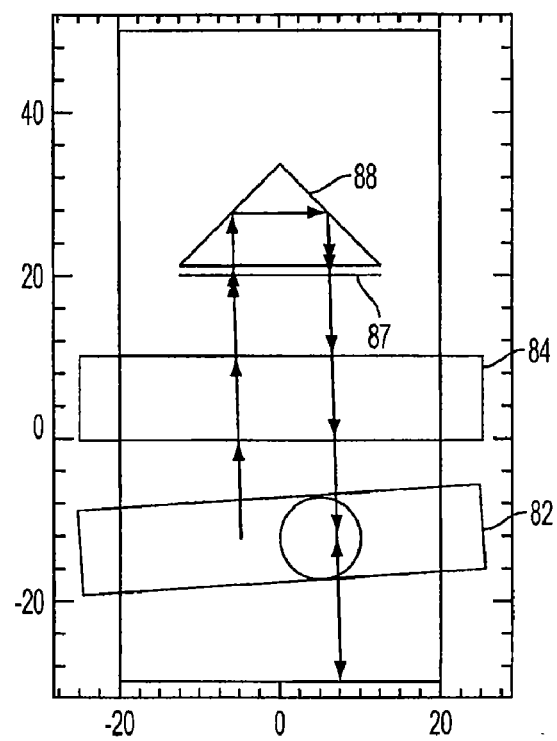
Figure 7D:
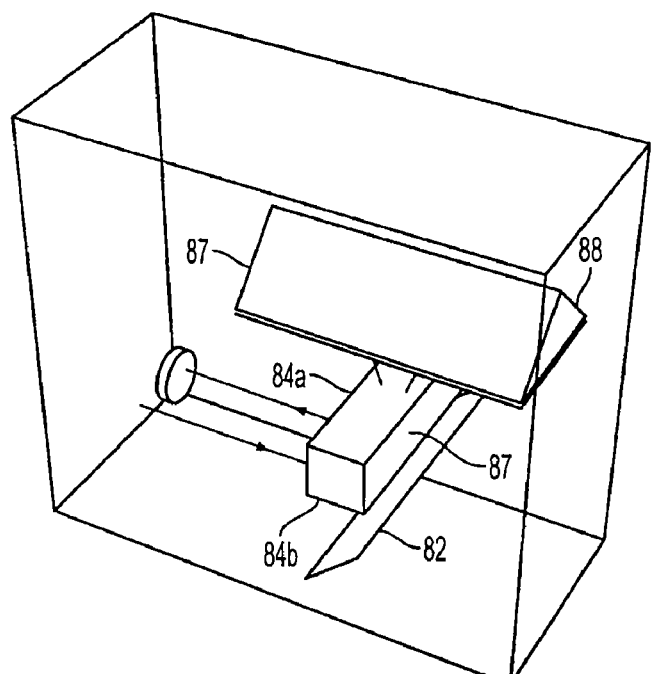

Although not shown in FIGS. 7a to 7d, it should be understood that the striations of the first and second diffraction gratings 83, 87 are arranged in a direction substantially perpendicular to the plane of the side view shown in FIG. 7b. Accordingly, the embodiment of FIGS. 5a-d provides a displacement measurement system that measures the relative displacement of the diffraction grating in a direction parallel to the direction of the beam of radiation provided by the source.

As shown in FIG. 7b, the first prism 84 may be arranged such that a first face 84a on the first prism 84, to which the first diffraction grating 83 is connected, may be parallel to a second face 84b of the first prism 84 from which the first order and negative first order diffractive radiation 85, 86 propagates before it is incident on the second diffraction grating 87. Conveniently, the first prism 84 may have a rectangular cross section.

In order to ensure that the radiation is propagating from the first and second point on the second diffraction grating 87 is reflected such that the reflected radiation, incident on the third and fourth points, respectively, on the second diffraction grating, is substantially parallel to the radiation propagating from the first and second points on the second diffraction grating 87, the second prism 88 may be a corner prism. In particular, as shown in FIGS. 7a to 7d, the second prism 88 may be an elongate corner prism, allowing the displacement measurement system to measure displacement of the first diffraction grating 83 relative to the second diffraction grating 87 at any point along the length of the second diffraction grating 87 (and hence the second prism 88).

As shown in the Figures, although the first order and negative first order diffracted radiation follow different beam paths for a significant proportion of the length of the beam path, for a significant portion of the beam path for which the first order and negative first order radiation is separated, the radiation is passing through the first and second prisms 84, 88, rather through the ambient air. Accordingly, because the portion of the total pathlength, for which the first and negative first order radiation follows different paths and passes through the air, is considerable shorter in an arrangement according to this embodiment compared to, for example, the conventional arrangement, the displacement measurement system is less sensitive to variations in the air through which the beam passes, such as turbulence and thermal variations.

As with the previously described embodiments, it will be appreciated that the first diffraction grating 83 may be attached to a first object and the second diffraction grating 87 attached to a second object. Accordingly, measurement of the displacement of the first diffraction grating 83 relative to the second diffraction grating 87 provides the measurement of the displacement of the first object relative to the second object. Conveniently, the first prism 84 may be connected to the first object and the second prism 88 may be connected to the second object. The radiation source 80, the sensor 90, and the reflector 82, where used, may each be connected to the second object.

Although not shown in FIGS. 7a to 7d, the displacement measurement system according to this embodiment, may be modified in a manner corresponding to that above to provide additionally a displacement measurement sensor that measures the displacement of the first diffraction grating 83 relative to the second diffraction grating 87 in a direction substantially perpendicular to the planes of the diffraction gratings 83, 87. In particular, an arrangement may be provided that is similar to that shown but modified such that, instead of, or as well as, comparing the first order radiation with the negative first order radiation 85, 86 diffracted by the first diffraction grating 83, it compares one of the first and negative first order diffractive radiation 85, 86 is with zero order radiation propagating from the first diffraction grating 83. In such an arrangement, the displacement of the first diffraction grating 83 relative to the second diffraction grating 87 may be measured by comparing the pathlengths of the zero order radiation and the one of the first and negative first order diffracted radiation.

It should be understood that, as with the embodiments discussed above, the displacement measuring system of the embodiment of FIGS. 7a-d relies on comparing radiation derived from two beam paths. Accordingly, in the manner discussed above, polarizers may be provided to polarize the radiation of the two beam paths in substantially mutually orthogonal directions.

Figure 7E:
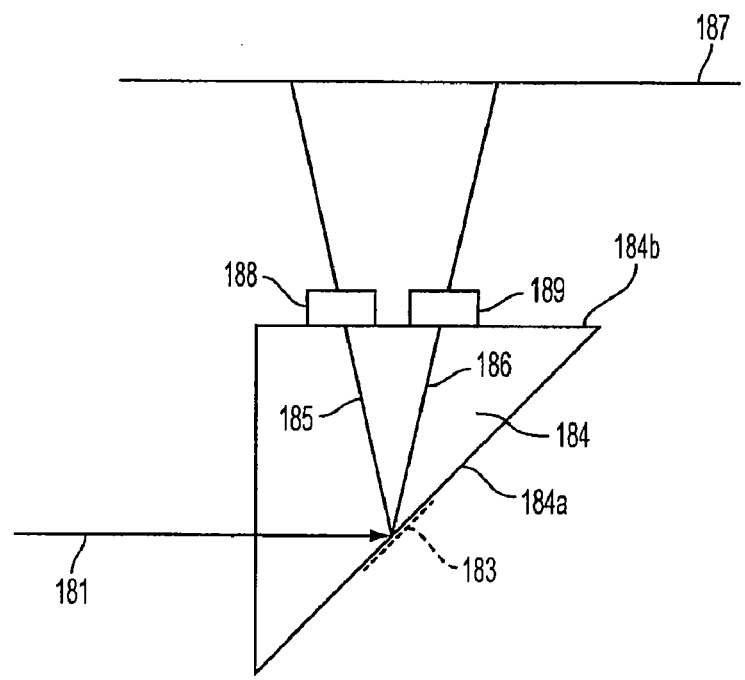

FIG. 7e depicts a variant of the arrangement of the displacement measurement system depicted in FIGS. 7a to 7d. In this variant, the first prism 84, which in the arrangement of FIGS. 7a to 7d has a rectangular cross section, and the reflector 82 are replaced by a single prism 184 arranged such that the beam of radiation 181 provided by the radiation source reflects off an inclined face 184a of the prism 184. The first diffraction grating 183 is reflective and arranged on the inclined face 184a of the prism 184. Accordingly, the beam of radiation 181 is diffracted by the diffraction grating 183 and the first order radiation and the negative first order radiation 185, 186 propagates through the prism 184 and may be polarized by respective polarizers 188, 189 arranged on a second face 184b of the prism 184, for example, before being incident on the second diffraction grating 187.

Figure 7F:
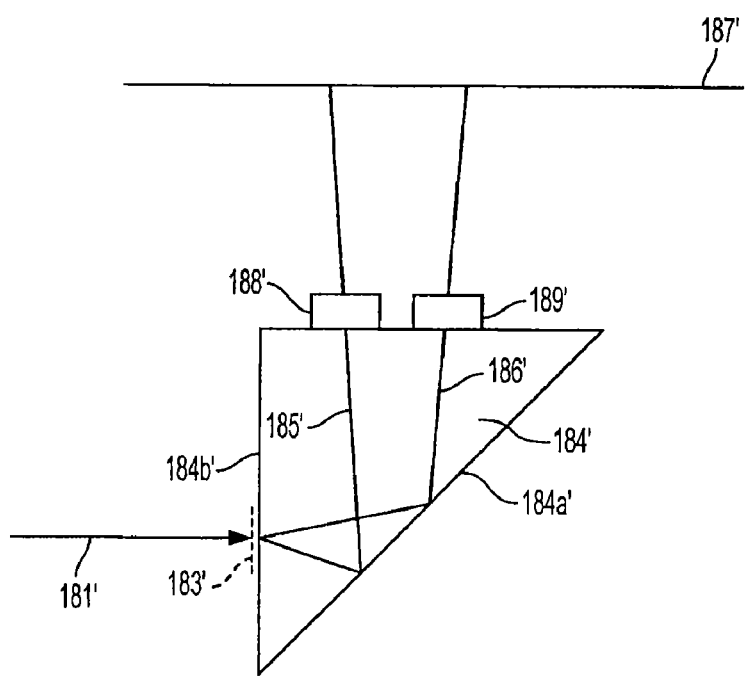

FIG. 7f depicts a variant that corresponds to the arrangement of the displacement measurement system depicted in FIG. 7e but replacing the reflective diffraction grating 183 with a transmissive diffraction grating 183' arranged on the face 184b' of the prism 184' on which the beam of radiation 181' is initially incident. Accordingly, the beam of radiation 181' is diffracted by the transmissive diffraction grating 183' and the first order and negative first order diffracted radiation 185', 186' propagates through the prism 184' are separately reflected by an inclined fact 184a' of the prism 184' and may be polarized by respective polarizers 188', 189' before being incident on the second diffraction grating 187'.

The arrangements of the displacement measurement system depicted in FIGS. 7e and 7f may be the same as those depicted in FIGS. 7a to 7d unless otherwise described above.

Figure 8A:
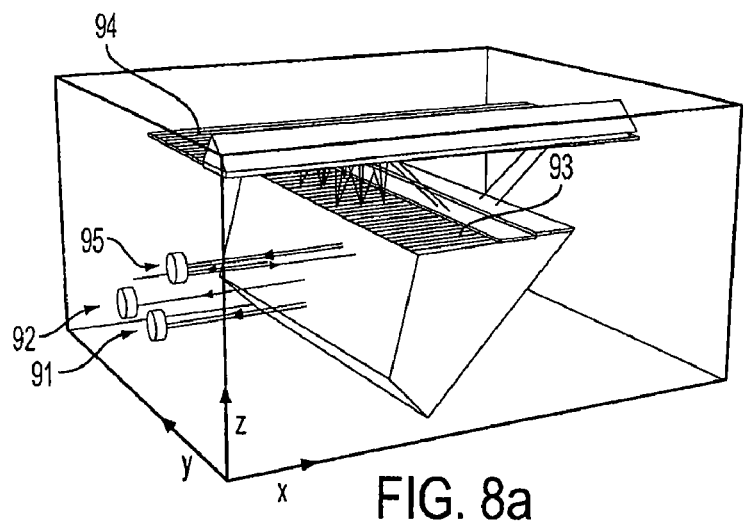
Figure 8B:
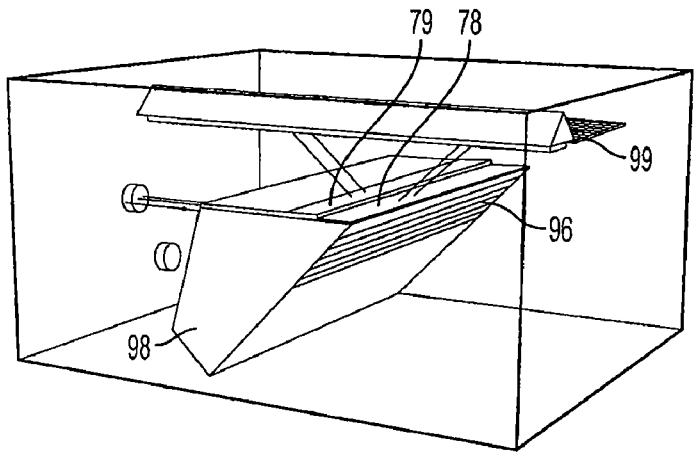
Figure 8C:
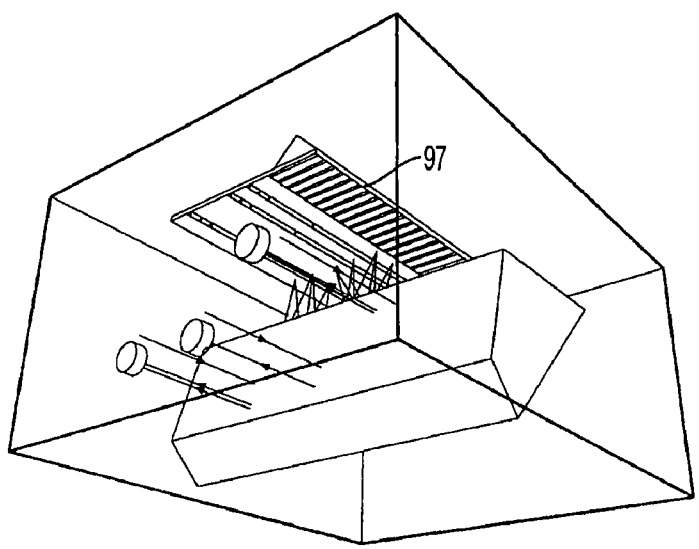
Figure 8D:
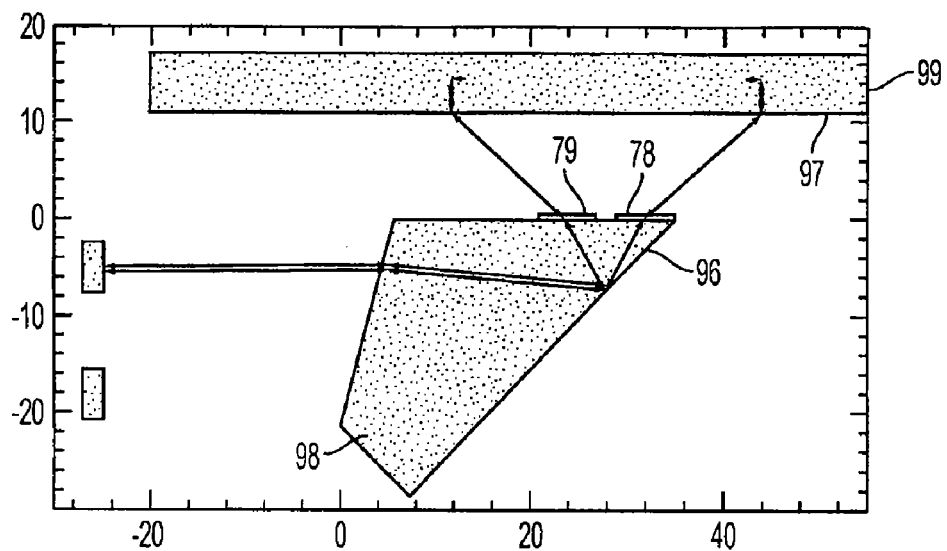
Figure 8E:
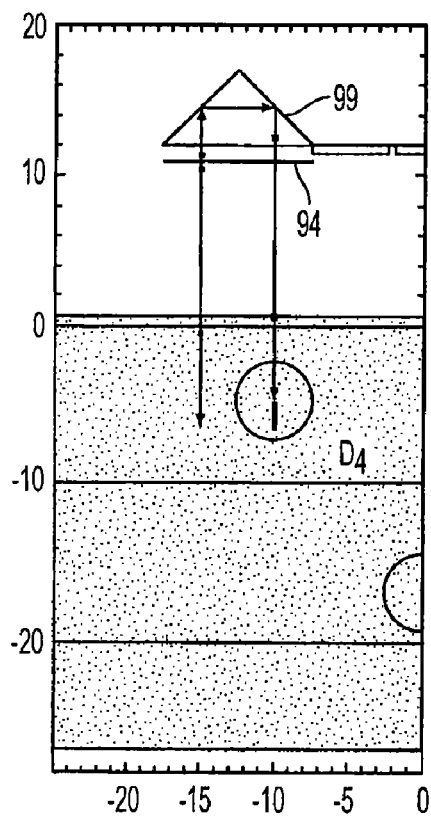

FIGS. 8a, 8b, and 8c depict perspective views of a displacement measurement system according to an embodiment of the present invention. FIGS. 8d and 8e depict a part of this displacement measuring system in more detail. The displacement measuring system of the embodiment provides an exemplary arrangement combining displacement measurement systems as described above. It should be appreciated that other combinations of the displacement measurements systems discussed above are possible and any such combinations should be considered to be within the scope of this application.

The system includes first and second displacement measuring systems 91, 92 that function in the same manner as the first and second displacement measurement systems 51, 52 depicted in FIGS. 5b and 5c as discussed above. Accordingly, the first and second displacement measurement systems, 91, 92 employ a first diffraction grating 93 and a second diffraction grating 94 and measure the relative displacement of the first and second diffraction gratings 93, 94 in a first direction within the plane of the diffraction gratings 93, 94 and substantially perpendicular to the striations of the first and second diffraction gratings 93, 94 and a second direction, substantially perpendicular to the plane of the diffraction gratings 93, 94, respectively. These directions correspond to the y and z direction, respectively depicted in FIG. 8a.

The system further includes a third displacement measurement system 95 that is similar to the embodiment of FIGS. 7a-d discussed above and measures the displacement of a third diffraction grating 96 relative to a fourth diffraction grating 97 in a direction substantially parallel to the first, second, and fourth diffraction gratings 93, 94, 97 but substantially perpendicular to the first measuring direction (which is also substantially perpendicular to the striations on the third and fourth diffraction gratings 96, 97). This corresponds to the x direction shown in FIG. 8a.

FIGS. 8d and 8e depict a side view and a front view, respectively, of the system depicted in FIGS. 8a, 8b, and 8c, but only showing the beam paths for the third displacement measurement system 95. In common with the embodiment of FIGS. 7a-d, a beam of radiation is diffracted by the third diffraction grating 96 (which corresponds to the first diffraction grating of the embodiment of FIGS. 7a-d) and first and negative first order diffracted radiation propagates through the prism 98 to which the third diffraction grating 96 is connected. The first and negative first order diffracted radiation is incident on first and second points on the fourth diffraction grating 97 (which corresponds to the second diffraction grating of the embodiment of FIGS. 7a-d), is further diffracted by the second diffraction grating and propagates through a second prism 99. The second prism 99 reflects the radiation derived from the first order and negative first order diffracted radiation diffracted by the third diffracting grating 96 such that it is incident on the third and fourth points on the fourth diffracting grating 97, respectively, in a direction substantially parallel to the direction that the radiation propagated from the first and second points on the fourth diffraction grating 97. The radiation incident on the third and fourth points on the fourth diffraction grating 97 is further diffracted, propagates through the first prism 98 and is incident on a second point on the third diffraction grating 96. As with the embodiment of FIGS. 7a-d, the radiation derived from the first and negative first order diffracted radiation diffracted by the third diffracting grating 96 returns to a common point, namely the second point, on the third diffraction grating 96. The radiation incident on the second point on the third diffracting grating 96 is further diffracted by the third diffraction grating 96 and propagates in a common direction as a second beam of radiation that is directed to the corresponding sensor of the third displacement measurement system 95.

As shown in FIGS. 8a to 8e, the difference between the third displacement measurement system 95 of the system depicted in FIGS. 8a to 8e and the displacement measurement system of the embodiment shown in FIGS. 7a-d is that the third diffraction grating 96 is reflective and mounted such that the first beam of radiation incident on a first point on the third diffracting grating 96 propagates through the first prism 98 in order to be incident on the third diffraction grating 96. Accordingly, as shown, the first prism 98 of the third displacement measurement system 95 can be the same prism as that used for the first and second displacement measurement systems 91, 92.

As shown, the third displacement measurement system 95 may include polarizers 78, 79, arranged in order to polarize the radiation derived from the first and negative first order diffracted radiation, respectively in substantially mutually orthogonal directions.

As described above, there is provided a displacement measurement system that can measure the displacement of a first diffraction grating relative to a second diffraction grating, parallel to the first diffraction grating, in a direction substantially parallel to the plane of the two diffraction gratings and substantially perpendicular to the striations of the diffraction gratings. In addition, the displacement measurement system may alternatively or additionally be configured to measure the displacement of the first diffraction grating relative to the second diffraction grating in a direction substantially perpendicular to the plane of the two diffraction gratings. By providing a third diffraction grating, adjacent to the first diffraction grating and arranged within the same plane as the first diffraction grating but with its striations substantially perpendicular to those of the first diffraction grating and by providing a fourth diffraction grating, adjacent the second diffraction grating and within the same plane as the second diffraction grating but with the striations of the fourth diffraction grating substantially perpendicular to those of the second diffraction grating, it is possible to provide a displacement measurement system that can also measure the displacement of the first and third diffraction grating (both connected to a first object) relative to the second and fourth diffraction gratings (both connected attached to a second object) in a direction substantially parallel to the plane of the diffraction gratings and substantially perpendicular to the first measurement direction. Use of such a system makes it possible to measure the position in three dimensions of one object relative to another. For example, in a lithographic apparatus, it is possible to use such a system to measure the position of a substrate table constructed to support a substrate relative to a reference frame in three dimensions.

Figure 9:
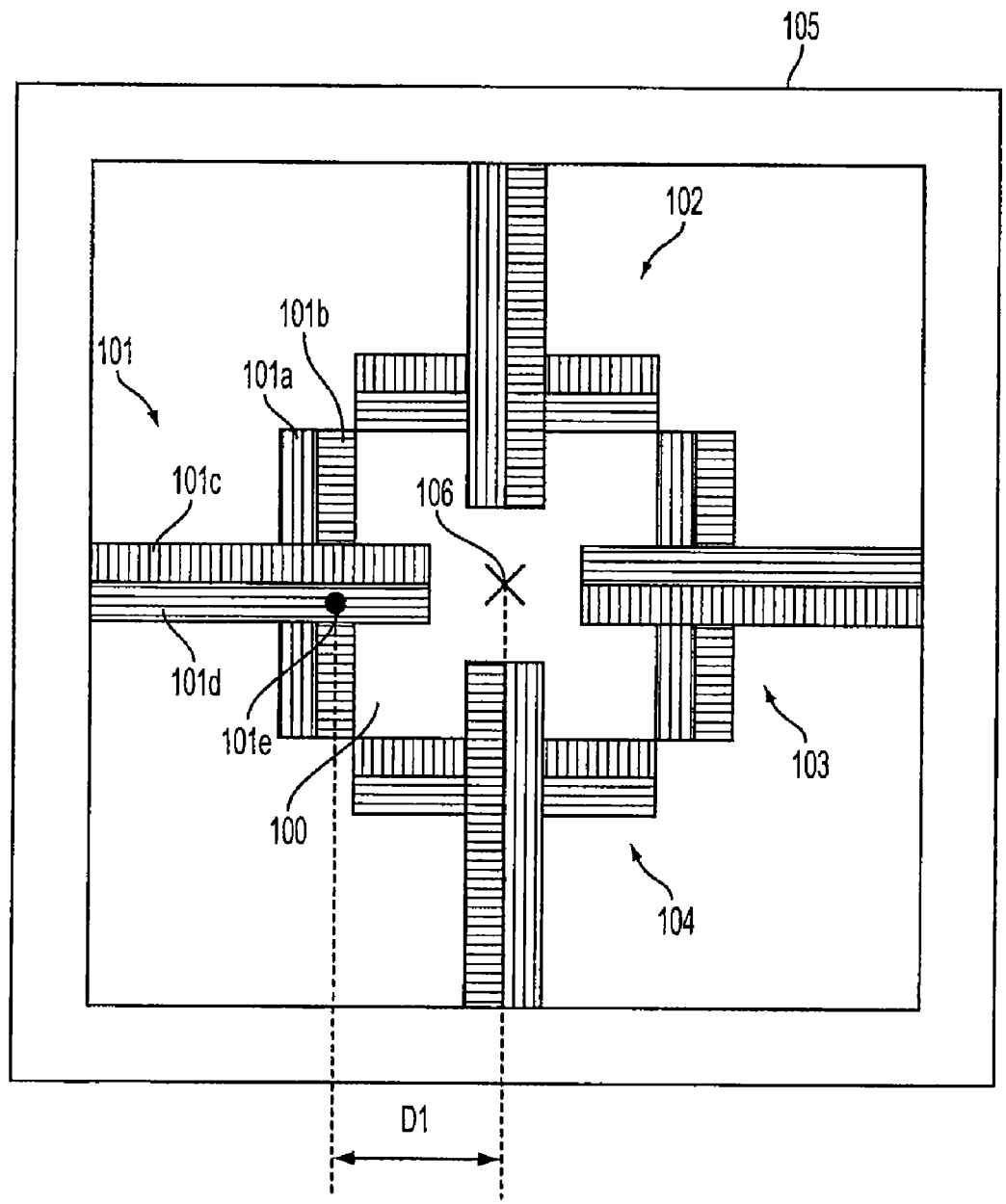
FIG. 9 depicts an arrangement of displacement measurement systems according to an embodiment of the present invention that may be used in conjunction with a lithographic apparatus.

FIG. 9 depicts a possible measurement system for a substrate table 100. The system includes four displacement measurement systems 101, 102, 103, 104 and described above. The first displacement measurement system 101 includes diffraction gratings 101a, 101b that are connected to the substrate table 100 and diffraction gratings 101c, 101d connected to the reference frame 105. As shown, diffraction gratings 101a and 101c have striations substantially parallel to the y axis as depicted in FIG. 9 and, accordingly, may be used to measure the movement of the substrate table 100 relative to the reference frame 105 in the x direction. By contrast, diffraction gratings 101b, 101d have striations substantially parallel to the x axis and, accordingly, may be used to measure the movement of the substrate table 100 relative to the reference frame 105 in the y direction.

The second, third, and fourth displacement measurement systems 102, 103, 104 have corresponding configurations. Accordingly, all four displacement measurement systems are capable of measuring movement of the substrate table 100 relative to the reference frame 105 in both the x and y directions. In addition, any or all of the displacement measurement systems may be configured to measure the movement of the substrate table 100 relative to the reference frame 105 in the z direction. This redundancy of information may be beneficial because, for example, it may yield information regarding any deformation, such as thermal expansion or contraction, of the substrate table 100.

Alternatively or additionally, the provision of multiple displacement measurement systems capable of measuring movement of the substrate table 100 relative to the reference frame 105 in the same direction may be used to determine rotational displacement. For example, any difference in the measured displacement in the z direction measured by the displacement measurement systems 101, 103 may be used to determine the rotational displacement of the substrate table 100 relative to the reference frame 105 about an axis substantially parallel to the y axis. Similarly, the difference in measured displacement in the z direction of the substrate table 100 relative to the reference frame 105, measured by the displacement measurement systems 102, 104 may be used to determine the rotational displacement of the substrate table 100 relative to the reference frame 105 about an axis parallel to the x axis. Furthermore, comparison of the measurement of the displacement of the substrate table 100 relative to the reference frame 105 in the x direction by the displacement measurement systems 102, 104 and, separately, comparison of the measurement of the displacement of the substrate table 100 relative to the reference frame 105 in the y direction measured by the displacement measurement systems 101, 103, provides a measurement of the rotational displacement of the substrate table 100 relative to the reference frame 105 about an axis parallel to the z axis.

The measurement of the rotation of the substrate table 100 relative to the reference frame 105 may be important, for example because in general, the position on the substrate at which the displacements in directions parallel to the x, y, and z axes of the substrate 100 relative to the reference frame 105 are measured is different from the point on the substrate 100 for which it is actually required to know the displacement. For example, the point of interest 106 on the substrate table 100 for which the displacement relative to the reference frame 105 is desired to be known may correspond to the point on which the projection beam of radiation is projected by the lithographic apparatus in order to expose the substrate. It should be appreciated therefore that, in general, the point of interest 106 will be fixed relative to the projection system of the lithographic apparatus which in turn may be fixed relative to the reference frame 105. Accordingly, the point of interest 106 is fixed relative to the reference frame 105 and, accordingly, as the substrate table 100 moves relative to the reference frame 105, the point of interest 106 moves relative to the substrate table. Effectively, therefore, the intention of measuring the displacement of the substrate table 100 relative to the reference frame 105 is to determine the location on the substrate table 100 of the point of interest 106.

As will be appreciated from consideration of FIG. 9, it is not possible to directly measure the displacement of the substrate table 100 at the point of interest 106. Instead, as discussed above, the displacement is measured at the point at which two diffraction gratings of a displacement measurement system cross. For example, in the arrangement depicted in FIG. 9, the first displacement measurement system 101 measures the displacement of the substrate table 100 relative to the reference frame 105 in a direction substantially parallel to the y axis at the point 101e at which diffraction gratings 101b, 101d cross. It should be appreciated that the displacement of the point on the substrate table 100 at the point of interest 106 in the direction substantially parallel to the y axis equals the displacement in the direction substantially parallel to the y axis measured by the first displacement measurement system 101 plus the product of the angular displacement of the substrate table 100 relative to the reference frame 105 about the z axis multiplied by the distance D1 in the x direction between the point of measurement 101e of the first displacement measurement system 101 and the point of interest 106. Accordingly, for an accurate displacement measurement at the point of interest 106 in directions parallel to the x, y, and z axes, it is also desirable to accurately determine the angular displacement about the x, y, and z axes.

As discussed above, angular displacements of the substrate table 100 relative to the reference frame 105 may be determined by comparing two linear displacement measurements. It should be appreciated that the accuracy of the determined angular displacement is determined by the accuracy of the measurement of the linear displacements and the separation of the measurement points for the measured linear displacements. In general, the greater the separation in a direction perpendicular to both the measurement direction of the linear displacement measurements and the axis about which it is intended to determine the angular displacement, the greater the accuracy of the determined angular displacement. Accordingly, as discussed above, in order to determine the angular displacement of the substrate table 100 relative to the reference frame 105 about the z axis, one may compare displacement measurements in the direction substantially parallel to the y axis by the first and third displacement measurement systems 101, 103 or displacement measurements in the direction substantially parallel to the x axis by the second and fourth displacement measurement systems 102, 104. In either case, the separation between the measurement points is at least the width of the substrate table 100. It would also be possible to determine the angular displacement of the substrate table 100 relative to the reference frame 105 about the z axis by comparing measurements of the linear displacement in directions parallel to the x or y directions by, for example, the first and fourth displacement measurement systems 101, 104. However, in this case, separation between the measurement points for the respective linear displacement measurements would be approximately half the width of the substrate and, accordingly, the accuracy would be lower.

It should be appreciated that it may be desirable to measure the angular displacement of the substrate table 100 relative to the reference frame 105 for its own sake. For example, in the case of the angular displacement about the z axis, this may be used in order to ensure correct overlay. However, as discussed above, the determination of the angular displacement may also be required in order to adjust linear displacement measurements in order to compensate for the difference between the point of measurement of a linear displacement and the point of interest 106. As discussed above, the correction to the linear displacement measurement corresponds to the product of the distance D1 between the point of interest 106 and the point of measurement 101e. Therefore, in order to minimize the correction and therefore the effect of any error in the determination of the angular displacement, it may be desirable to minimize the distance D1 between the point of interest 106 and the point of measurement 101e. In general, the accuracy of the measurement of the linear displacement, including the correction for the angular displacement, can be maximized by maximizing the size of the separation between the points of measurement used to determine the angular displacement relative to the size of the separation between the point of interest and a measuring point 101e used to determine the uncorrected linear displacement. It has been found that an adequate accuracy may be provided if the former is at least twice the latter.

It should be appreciated that each portion of a displacement measurement system as described above that is used to measure a displacement in a single direction may be constructed according to any one of the embodiments described above. It should further be appreciated that, although this embodiment has been described with reference to measuring the displacement of a substrate table 100 relative to a reference frame 105 in a lithographic apparatus, the displacement measurement system described may, in general, be used to measure the displacement of any component relative to another component.

Figure 10:
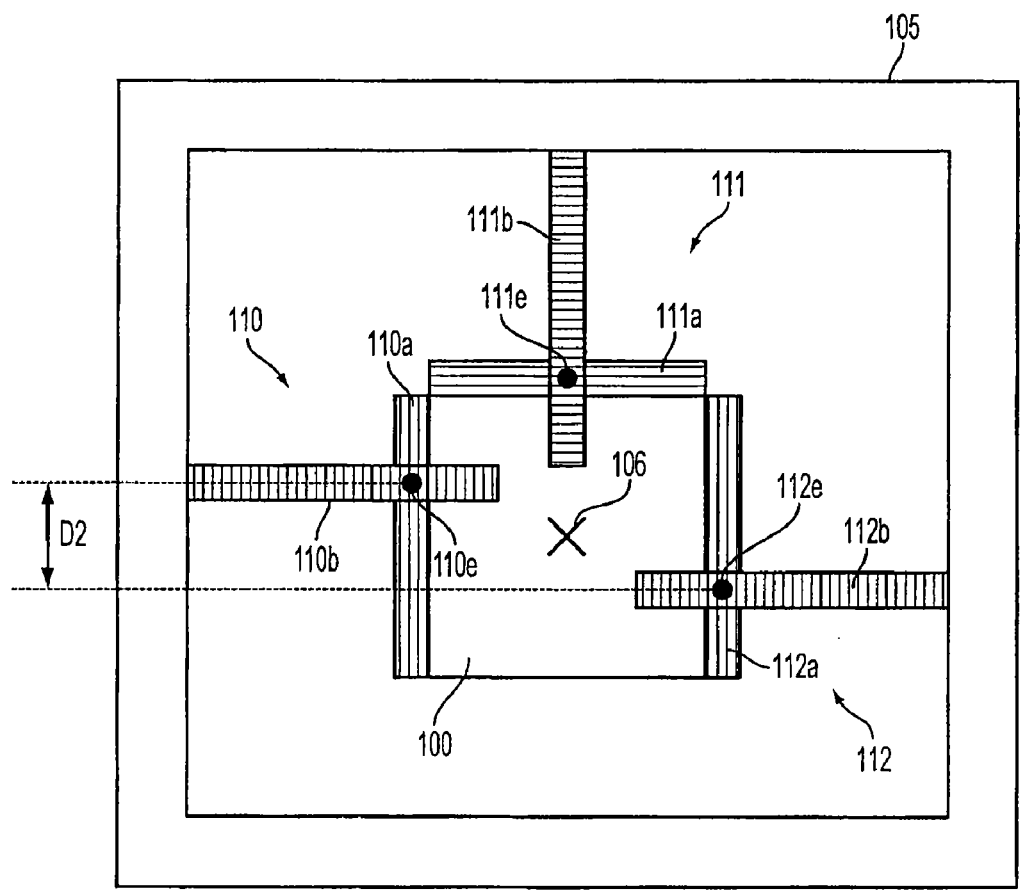
FIG. 10 depicts an arrangement of displacement measurement systems according to an embodiment of the present invention.

FIG. 10 depicts a displacement measurement system that may be used to measure the position of, for example, a substrate table in a lithographic apparatus. As shown, this system has less redundancy than the system discussed above in relation to FIG. 9. In particular, there are three displacement measurement systems 110, 111, 112. The first displacement measurement system 110 has a first grating 110a connected to the substrate table 100 and a second diffraction grating 110b connected to the reference frame 105. Both gratings have their striations oriented substantially parallel to the y axis. Accordingly, the first displacement measure system 110 may be used to measure the displacement of the substrate table 100 relative to the reference frame 105 in a direction substantially parallel to the x axis. The second displacement measurement system 111 has a first diffraction grating 111a connected to the substrate table 100 and a second diffraction grating 111b connected to the reference frame 105. Both diffraction gratings of the second displacement measurement system have their striations oriented parallel to the x axis. Accordingly, the second displacement measurement system 111 may be used to measure the displacement of the substrate table 100 relative to the reference frame 105 in a direction parallel to the y axis. Accordingly, the first and second displacement measurement systems provide sufficient information in order to measure the displacement of the substrate table 100 relative to the reference frame 105 in the x-y plane.

The third displacement measurement system 112 has a first diffraction grating 112a connected to the substrate table 100 and a second diffraction grating 112b connected to the reference frame 105. As with the first displacement measurement system 110, the diffraction gratings 112a, 112b of the third displacement measurement system 112 are oriented such that the striations of the diffraction gratings 112a, 112b are substantially parallel to the y axis. Accordingly, the third displacement measurement system 112 may, as discussed above, be used in conjunction with the first displacement measurement system 110 in order to measure distortions of the substrate table for example, in the x direction. However, alternatively or additionally, the diffraction gratings 110b, 112b of the first and third displacement measurement systems 110, 112 that are connected to the reference frame 105, may be connected as shown in FIG. 10. In this arrangement, diffraction gratings 110b, 112b are connected to the reference frame 105 in an offset manner. In particular, the diffraction grating 110b is connected to the reference frame 105 at a different position along the y axis than the diffraction grating 112b. Consequently, any rotation of the substrate table 100 about the z axis relative to the reference frame 105, is identified by a difference between the measurement of the displacement of the substrate table 100 relative to the reference frame in the x direction by the first and third displacement measurement systems 110, 112.

In the arrangement depicted in FIG. 10, the diffraction grating 111b of the second displacement measurement system 111 is aligned with the point of interest 106. Accordingly, regardless of the movement of the substrate table 100 relative to the reference frame 105, the point of measurement 111e of the displacement in the y direction by the second displacement measurement system 111 will always be aligned with the point of interest 106. Accordingly, the separation between the measurement position 111e of the first displacement measurement system 111 and the point of interest 106 in the x direction is zero and any rotation of the substrate table 100 relative to the reference frame 105 about the z axis will not affect the accuracy of the measurement of the linear displacement in the direction parallel to the y axis.

As discussed above, the accuracy of the determination of the angular displacement of the substrate table 100 relative to the reference frame 105 about the z axis is determined by the separation D2 in the y direction between the points of measurement 110e, 112e of the linear displacement in the x direction of the first and third displacement measurement systems 110, 112. Accordingly, adjusting the position of the diffraction gratings 110b, 112b that are attached to the reference frame 105 in order to increase the separation D2 may increase the accuracy of the determination of the angular displacement about the z axis.

Although the use of a determination of the angular displacement of the substrate table 100 relative to the reference frame 105 in order to correct linear displacement measurements to compensate for the difference in position between the point of interest 106 and the points of measurement has been discussed above, in certain circumstances, this may not be required. For example, in the arrangement depicted in FIG. 10, the diffraction gratings 110b, 112b of the first and third displacement measurement systems 110, 112 that are connected to the reference frame 105 are positioned such that the respective measurement points 110e, 112e of the first and second displacement measurement systems 110, 112 are on either side of and equidistant from the point of interest 106 in the y direction. Accordingly, the average of the linear displacements in the x direction measured by the first and third displacement measurement systems 110, 112 is the linear displacement in the x direction at the point of interest 106, regardless of the angular displacement of the substrate table 100 about the z axis. Similar arrangements may be provided to provide accurate linear displacement measurements that are not susceptible to error caused by angular displacement for measurements in the y and z directions.

As discussed above, the displacement measurement systems may be configured to measure the relative displacement of the two diffraction gratings of a displacement measurement system in a direction substantially perpendicular to the plane of the diffraction gratings. Accordingly, it may be desirable to configure the displacement measurement systems 110, 111, 112 such that one or more of these can measure the relative movement of its respective diffraction gratings in a direction parallel to the z axis. In such a system it is then possible to measure the displacement of the substrate table 100 relative to the reference frame 105 in a direction parallel to the z axis in addition to displacement in the x-y plane. In addition, by comparing the displacement in the z direction determined from two of the displacement measurement systems 110, 111, 112, it is possible to determine the rotation of the substrate table 100 relative to the reference frame 105 about the x and y axes. Accordingly, it is possible to provide a measurement system that can measure displacements in six degrees of freedom.

Figure 11:
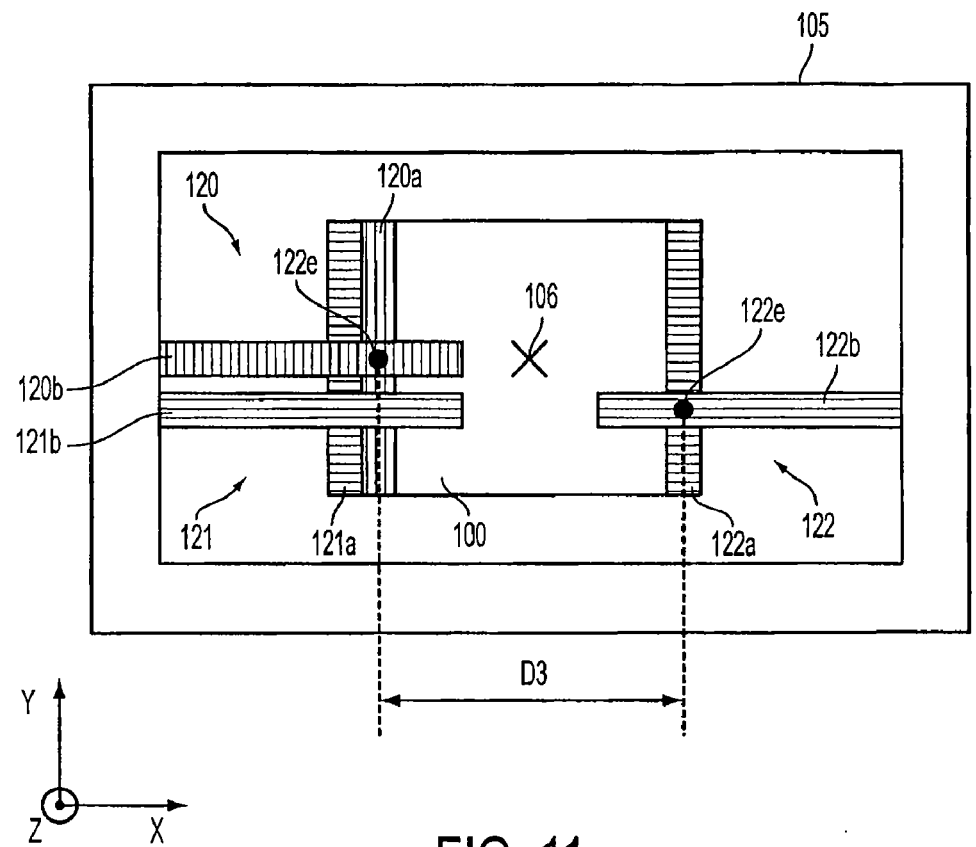
FIG. 11 depicts an arrangement of displacement measurement systems according to an alternative embodiment of the present invention.

FIG. 11 depicts a further embodiment of the invention. Similar to the arrangement depicted in FIG. 10, the arrangement includes first and second displacement measurement systems 121, 122 that measure the displacement of the substrate table 100 relative to the reference frame 105 in the y direction and, optionally, in the z direction and a third displacement measurement system 120 that measures the displacement of the substrate table 100 relative to the reference frame 105 in the x direction. However, as shown, the difference between the arrangement depicted in FIG. 11 and the arrangement depicted in FIG. 10 is that the first and second displacement measurement systems 121, 122 are arranged such that the diffraction gratings 121a, 122a that are connected to the reference frame 105 are elongate in a direction substantially parallel to the x axis, namely in a direction substantially parallel to the striations of the diffraction gratings. Likewise, the diffraction grating 120a of the first displacement measurement system 120 that is connected to the reference frame 105 is elongate and extends in a direction substantially parallel to the x axis, in this case substantially perpendicular to its striations. Accordingly, it is not necessary to have any components of the displacement measurement system extending from the reference frame 105 in a direction parallel to the y axis. Such an arrangement may be beneficial in order to avoid a conflict with other components of, for example, the lithographic apparatus.

A further benefit of such an arrangement over that depicted in FIG. 10 is that the accuracy of the measurement of the rotational displacement of the substrate table 100 relative to the reference frame 105 about an axis parallel to the z axis is improved. This is because the separation D3, in a direction substantially parallel to the x axis, of the points of measurement 121e, 122e of the displacement of the substrate table 100 relative to the reference frame 105 in the y direction of the first and second displacement measurement systems 121, 122 is significantly greater in this configuration than the separation, in the y direction, of the point of measurement of the displacement of the substrate table 100 relative to the reference frame 105 in the x direction of the first and third displacement measurement systems 110, 112 depicted in FIG. 10.

In a manner that corresponds to the arrangement of the second displacement measurement system 111 for measuring the displacement in the y direction discussed in relation to FIG. 10, in the arrangement of FIG. 11 the diffraction grating 120b of the third displacement measurement system 120 that is attached to the reference frame 105 is aligned with the point of interest 106 such that measurements of the linear displacement in the x direction are not affected by the angular displacement of the substrate table 100 relative to the reference frame 105 about the z axis.

A further benefit of an arrangement such as that depicted in FIG. 11, in which measurements of the displacement of the substrate table 100 relative to the reference frame 105 in a first direction (in this case, the y direction by the first and second displacement measurement systems 121, 122) at measurement positions that are set apart in a direction along a direction substantially perpendicular to the measuring direction (in this case, along the x direction), is that by taking the average of the measurements of the displacement in the measurement direction, errors introduced by a rotational displacement about an axis substantially perpendicular to the measurement direction and the direction in which the measurement positions are set apart (in this case about the z axis) are eliminated. As before, the greater the separation of the measurement points of the two displacement measurement systems, the greater the accuracy. It should be appreciated that this feature may also be effected by the other embodiments of this invention.

It will be appreciated that, likewise, the system could be arranged such that all the components of the displacement measurement system extend from the substrate table 100 in a direction parallel to the y axis and none in a direction parallel to the x axis.

As will be apparent, and as in the seventh embodiment, the eighth embodiment may be configured to provide a measurement system that can measure displacements in six degrees of freedom.

Figure 12:
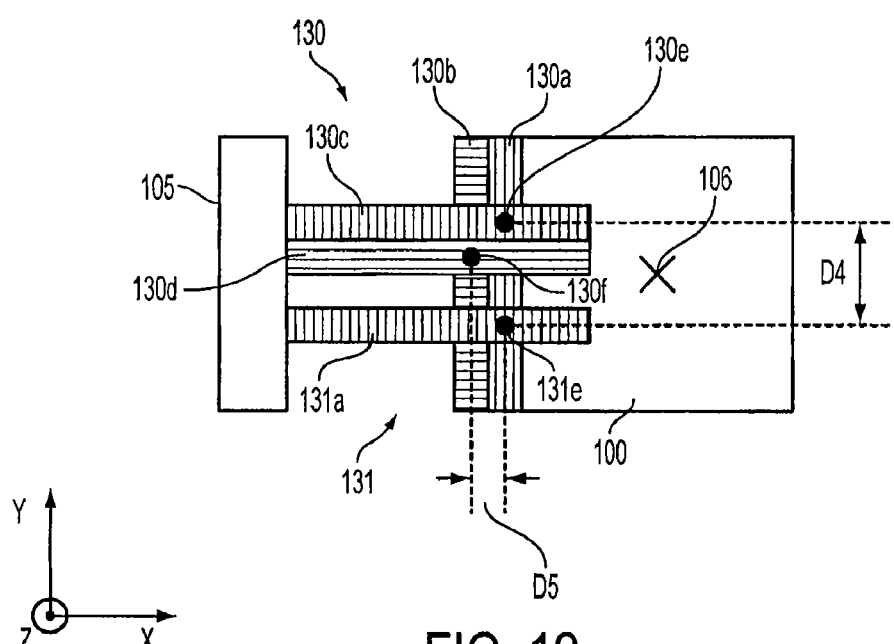
FIG. 12 depicts an arrangement of displacement measurement systems according to a further embodiment of the invention.

FIG. 12 depicts a further alternative arrangement, according to a ninth embodiment relating to a second aspect of the present invention.

This arrangement includes a first and a second displacement measurement system 130, 131. The first displacement measurement system 130 has first and second diffraction gratings 130a, 130b connected to the substrate table 100. The first diffraction grating 130a is arranged with its striations substantially parallel to the y axis. The second diffraction grating 130b is arranged with its striations substantially parallel to the x axis. The first displacement measurement system 130 further includes third and fourth diffraction gratings 130c, 130d connected to the reference frame 105. The third diffraction grating 130c is arranged with its striations substantially parallel to the y axis and, accordingly, may be used in conjunction with the first diffraction grating 130a in order to measure the displacement of the substrate table 100 relative to the reference frame 105 in the x direction. The fourth diffraction grating 130d is arranged with its striations substantially parallel to the x axis and accordingly may be used in conjunction with the second diffraction grating 130b to measure the displacement of the substrate table 100 relative to the reference frame 105 in a direction parallel to the y axis.

The second displacement measurement system 131 includes a diffraction grating 131a connected to the reference frame 105 and arranged such that its striations are parallel to the y axis. The diffraction grating 131a of the second displacement measurement system 131 is arranged on the same side of the substrate table 100 as the first displacement measurement system 130. Accordingly, the diffraction grating 131a of the second displacement measurement system 131 may be used in conjunction with the first diffraction grating 130a of the first displacement measurement system in order to provide a further measurement of the displacement of the substrate table 100 relative to the reference frame 105 in a direction substantially parallel to the x direction. Therefore, although the entirety of the displacement measurement system is arranged on a single side of the substrate table, and therefore leaves the other three sides of the substrate table free for other components of the lithographic apparatus, it is still possible to measure the displacement of the substrate table 100 relative to the reference frame 105 in the x direction and the y direction.

Furthermore, by comparing the two displacement measurements in the x direction from the first and second displacement measurement systems 130, 131, the rotation of the substrate table 100 relative to the reference frame 105 about the z axis may be determined. As discussed above, the accuracy of the determination of the angular displacement of the substrate table 100 relative to the reference frame 105 about the z axis is limited by the separation D4 in the y direction between the points of measurement 130e, 131e of the first and second displacement measurement systems 130, 131.

As before, both the first and the second displacement measurement systems may be configured to additionally measure the displacement of their respective gratings in the z direction. Accordingly, it is possible to measure the displacement of the substrate table 100 relative to the reference frame 105 in the z direction and rotationally about the x and y axes. For example, the angular displacement about the x axis may be determined by comparing the measured linear displacements in the z direction, for example at measurement points 130e, 131e, in which case the accuracy of the determined angular displacement will, again, be determined by the separation D4 between the measurements points 130e, 131e in the y direction. The angular displacement about the y axis of the substrate table 100 relative to the reference frame 105 may be determined by comparing the measured linear displacement in the z direction measured by the first displacement measurement system at a measurement point 130f using the diffraction gratings 130b, 130d that are also used to determine the displacement in the y direction, with either of the measured linear displacements in the z direction measured at measuring points 130e, 131e. However, in this case, the accuracy of the determined angular displacement will be limited by the separation D5 in the x direction between the first measuring point 130f and either of the other measuring points 130e, 131e. Accordingly, the accuracy of the determination of the angular displacement about the y axis may be significantly less than the accuracy of the determination of the angular displacement about the x axis because the separation D5 is significantly smaller than the separation D4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157, or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A displacement measuring system configured to measure a displacement between first and second components, the displacement measuring system comprising:
   a first elongated diffraction grating formed on a first face of a prism mounted to the first component, the first elongated diffraction grating having an elongated direction orientated substantially parallel to a first direction;
   a second elongated diffraction grating connected to the second component, the second elongated diffraction grating having an elongated direction orientated substantially parallel to a second direction which is not parallel to the first direction; and
   a first sensor configured to detect a first pattern of radiation generated by the diffraction of at least one beam of radiation by the first and second elongated diffraction gratings;
   wherein the first face of the prism is configured to receive the diffracted radiation beam from the first elongated diffraction grating and a second face of the prism is configured to re-direct the diffracted radiation beam such that the diffracted radiation beam is incident on the first elongated diffraction grating on the first face and diffracted in turn by the first elongated diffraction grating, then the second elongated diffraction grating, and then the first elongated diffraction grating, and
   wherein the first pattern of radiation is indicative of the displacement of the first elongated diffraction grating relative to the second elongated diffraction grating in a third direction orientated substantially perpendicular to both the first and the second direction.

2. The displacement measuring system according to claim 1, further comprising a second sensor configured to detect a second pattern of radiation generated by the diffraction of at least one beam of radiation by the first and second elongated diffraction gratings, wherein the second pattern of radiation is indicative of the displacement of the first elongated diffraction grating relative to the second elongated diffraction grating in the third direction.

3. The displacement measuring system according to claim 2, wherein the second sensor is separated from the first sensor in the first direction.

4. A displacement measuring system according to claim 1, further comprising:

a third elongated diffraction grating attached to the first component and oriented such that its elongated direction is substantially parallel to the first direction;

a second sensor configured to detect a second pattern of radiation generated by diffraction of at least one beam of radiation by the second and third elongated diffraction gratings;

a fourth elongated diffraction grating attached to the first component and oriented such that its elongated direction is substantially parallel to the first direction;

a fifth elongated diffraction grating attached to the second component and oriented such that its elongated direction is substantially parallel to the second direction; and a third sensor configured to detect a third pattern of radiation generated by the diffraction of at least one beam of radiation by the fourth and fifth elongated diffraction gratings;

wherein the third pattern of radiation is indicative of a displacement of the fourth elongated diffraction grating relative to the fifth elongated diffraction grating in at least one of the first, second and third directions.

5. A displacement measuring system according to claim 4, wherein said third pattern is indicative of a displacement of the fourth elongated diffraction grating relative to the fifth elongated diffraction grating in the third direction; and the displacement measurement system determines a rotational displacement of the first component relative to the second component from the difference in the displacements in the third direction indicated by the first and third patterns of radiation.

6. A displacement measuring system according to claim 4, wherein striations of the fourth and fifth diffraction gratings are substantially perpendicular to the first direction; and the third pattern of radiation is indicative of a displacement of the fourth elongated diffraction grating relative to the fifth elongate diffraction grating in the first direction.

7. A displacement measuring system according to claim 6, wherein said first pattern of radiation is indicative of a displacement of the first elongated diffraction grating relative to the second elongated diffraction grating in the first direction; and the displacement measuring system determines the displacement of the first component relative to the second component in the first direction from an average of the displacements in the first direction indicated by the first and third patterns.

8. A displacement measuring system according to claim 4, wherein striations of the fourth and fifth elongated diffraction gratings are substantially perpendicular to the second direction; and the third pattern of radiation is indicative of a displacement of the fourth elongated diffraction grating relative to the fifth elongated diffraction grating in the second direction.

9. A displacement measuring system according to claim 4, further comprising:

a sixth elongated diffraction grating attached to the first component and oriented such that its elongated direction is substantially parallel to the second direction;

a seventh elongated diffraction grating attached to the second component and oriented such that its elongated direction is substantially parallel to the first direction; and a fourth sensor configured to detect a fourth pattern of radiation generated by diffraction of at least one beam of radiation by the sixth and seventh elongated diffraction gratings;

wherein the fourth pattern of radiation is indicative of a displacement of the sixth elongate grating relative to the seventh elongated diffraction grating in at least one of the first, second and third directions.

10. A displacement measuring system according to claim 9, wherein said third pattern is indicative of a displacement of the sixth elongated diffraction grating relative to the seventh elongated diffraction grating in the third direction; and the displacement measurement system determines a rotational displacement of the first component relative to the second component from a difference in displacements in the third direction as indicated by the first and fourth patterns of radiation.

11. A displacement measuring system according to claim 9, wherein striations of the sixth and seventh diffraction gratings are substantially perpendicular to the first direction; and the fourth pattern of radiation is indicative of a displacement of the sixth elongated diffraction grating relative to the seventh elongated diffraction grating in the first direction.

12. A displacement measuring system according to claim 9, wherein striations of the sixth and seventh elongated diffraction gratings are substantially perpendicular to the second direction; and the fourth pattern of radiation is indicative of a displacement of the sixth elongated diffraction grating relative to the seventh elongated diffraction grating in the second direction.

13. The displacement measuring system according to claim 1, further comprising a third sensor configured to detect a third pattern of radiation generated by the diffraction of at least one beam of radiation by the first and second elongated diffraction gratings, wherein the third pattern of radiation is indicative of a displacement of the first elongated diffraction grating relative to the second elongated diffraction grating in a direction substantially perpendicular to striations of the first and second elongated diffraction.

14. The displacement measuring system according to claim 3, wherein the first pattern of radiation detected by the first sensor and the second pattern of radiation detected by the second sensor determine a rotational displacement of the first component relative to the second component about an axis substantially parallel to the second direction from a difference in the displacements in the third direction indicated by the first and second patterns of radiation.

15. The displacement measuring system according to claim 1, wherein the first direction is substantially perpendicular to the second direction.

16. The displacement measuring system according to claim 1, further comprising:

a third elongated diffraction grating formed on the face of the prism mounted to the first component, the third elongated diffraction grating having an elongated direction orientated substantially parallel to the first direction; and a fourth elongated diffraction grating formed on the face of a second prism mounted to the second component, the fourth elongated diffraction grating having an elongated direction orientated substantially parallel to the second direction.

17. The displacement measuring system according to claim 16, further comprising:

a second sensor configured to detect a second pattern of radiation generated by the diffraction of at least one beam of radiation by the first and second elongated diffraction gratings, wherein the second pattern of radiation is indicative of the displacement of the first elongated diffraction grating relative to the second elongated diffraction grating in a direction substantially perpendicular to striations of the first and second elongated diffraction gratings; and a third sensor configured to detect a third pattern of radiation generated by the diffraction of at least one beam of radiation by the third and fourth elongated diffraction gratings, wherein the third pattern of radiation is indicative of the displacement of the third elongated diffraction grating relative to the fourth elongated diffraction grating in a direction substantially perpendicular to striations of the third and fourth elongated diffraction gratings.

* * * * *